US009786712B2

(12) United States Patent
Fujimoto et al.

(10) Patent No.: US 9,786,712 B2
(45) Date of Patent: Oct. 10, 2017

(54) RADIATION IMAGE PICKUP UNIT AND RADIATION IMAGE PICKUP DISPLAY SYSTEM

(71) Applicant: SONY CORPORATION, Tokyo (JP)

(72) Inventors: Shinji Fujimoto, Kanagawa (JP); Hironori Kikkawa, Kanagawa (JP); Yasuhiro Yamada, Kanagawa (JP); Michiru Senda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/906,798

(22) PCT Filed: Jul. 4, 2014

(86) PCT No.: PCT/JP2014/003563
§ 371 (c)(1),
(2) Date: Jan. 21, 2016

(87) PCT Pub. No.: WO2015/011880
PCT Pub. Date: Jan. 29, 2015

(65) Prior Publication Data
US 2016/0163763 A1 Jun. 9, 2016

(30) Foreign Application Priority Data

Jul. 24, 2013 (JP) .................................. 2013-153318

(51) Int. Cl.
*H01L 27/146* (2006.01)
*G01T 1/20* (2006.01)

(52) U.S. Cl.
CPC ...... *H01L 27/14663* (2013.01); *G01T 1/2018* (2013.01); *H01L 27/14625* (2013.01)

(58) Field of Classification Search
CPC ......... H01L 27/14625; H01L 27/14665; H01L 27/14687; H01L 27/14663; G01T 1/2018
See application file for complete search history.

(56) References Cited

U.S. PATENT DOCUMENTS

| 4,543,489 A * | 9/1985 | Harada ............ H01L 27/14665 |
| | | 250/208.1 |
| 5,506,409 A | 4/1996 | Yoshida et al. |
| 2002/0070343 A1 | 6/2002 | Hoffman |
| 2012/0232385 A1* | 9/2012 | Hattori .................. G01T 1/1648 |
| | | 600/436 |

FOREIGN PATENT DOCUMENTS

| EP | 1387185 A1 | 2/2004 |
| JP | 2002-228757 A | 8/2002 |

* cited by examiner

*Primary Examiner* — David Porta
*Assistant Examiner* — Faye Boosalis
(74) *Attorney, Agent, or Firm* — Chip Law Group

(57) ABSTRACT

There is provided a radiation image pickup unit including: a plurality of pixels each configured to generate a signal charge based on a radiation; a device substrate including a photoelectric conversion element for each pixel; a wavelength conversion layer provided on a light incident side of the device substrate, and configured to convert a wavelength of the radiation into other wavelength; and a partition wall separating the wavelength conversion layer for each pixel. The radiation image pickup unit is configured to allow a gap between the wavelength conversion layer and the device substrate to be equal to or larger than a threshold or equal to or smaller than the threshold, the threshold being preset based on a spatial frequency of an image pickup target.

11 Claims, 16 Drawing Sheets

[Fig. 1]
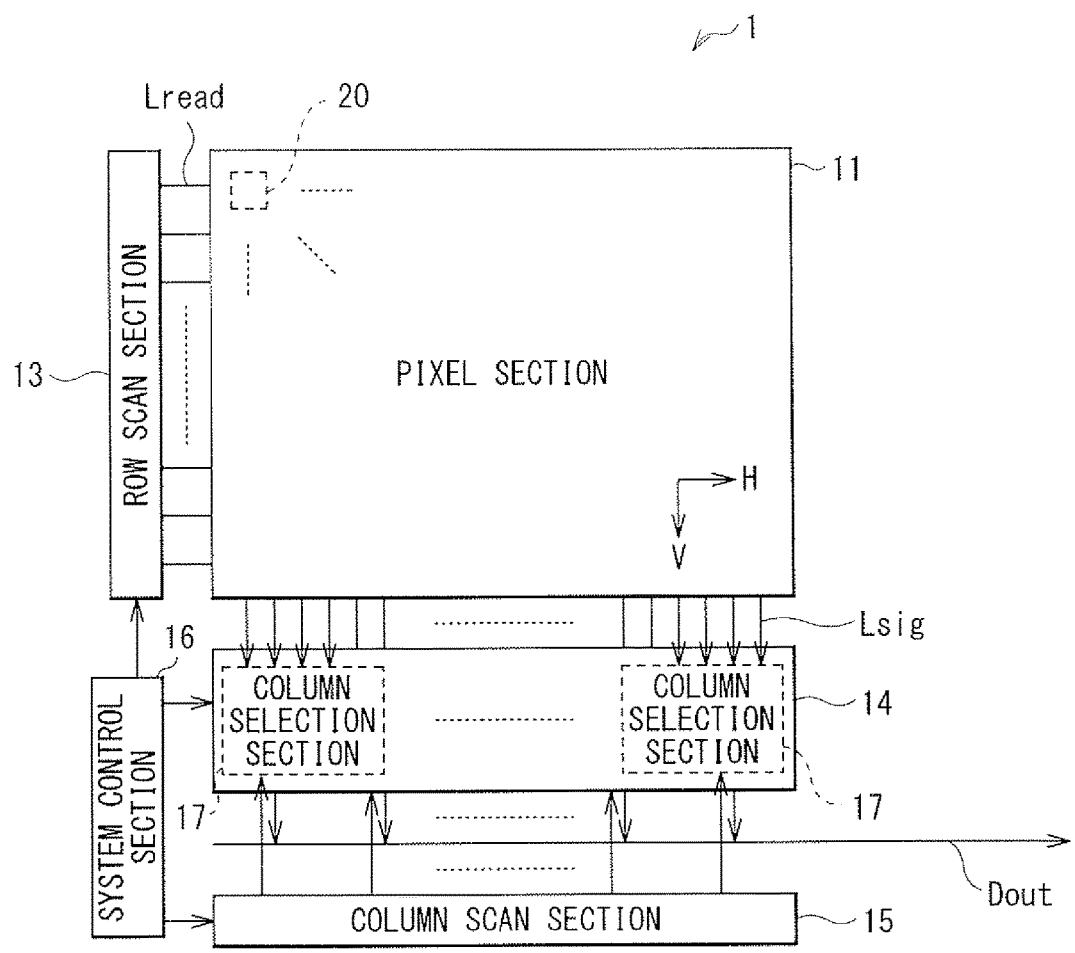

[Fig. 2]
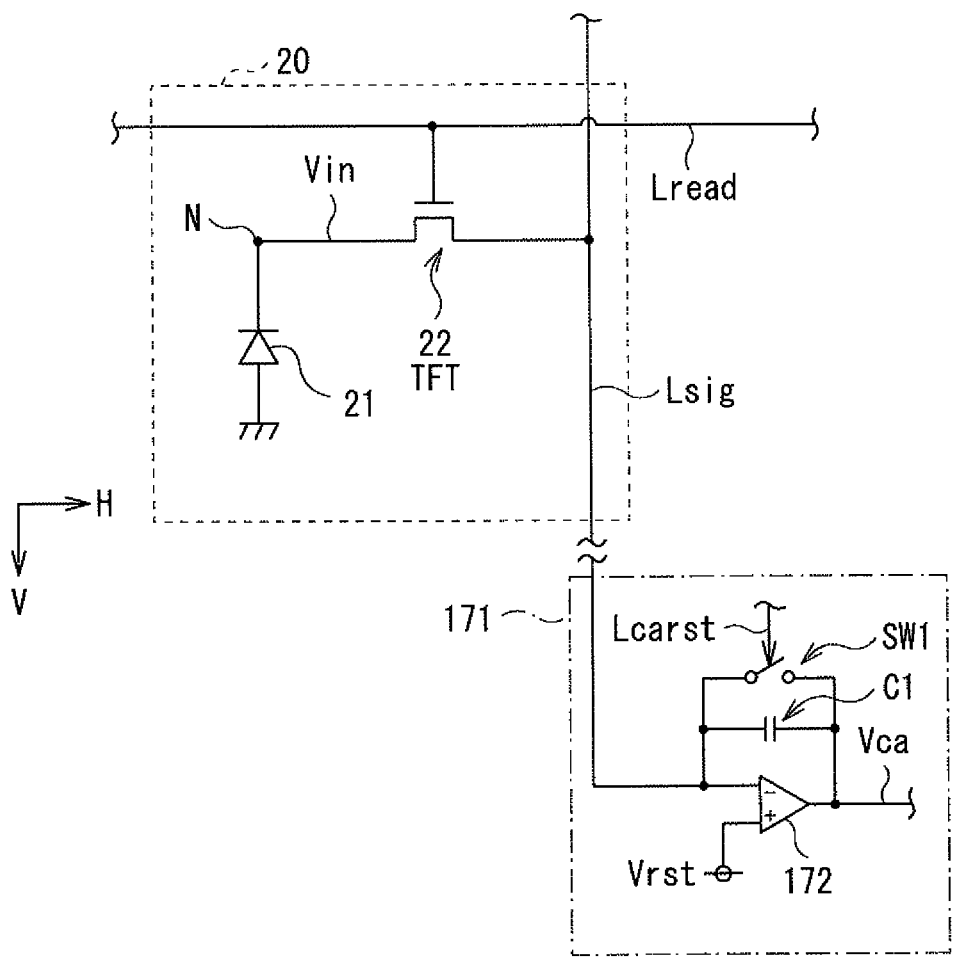

[Fig. 3]
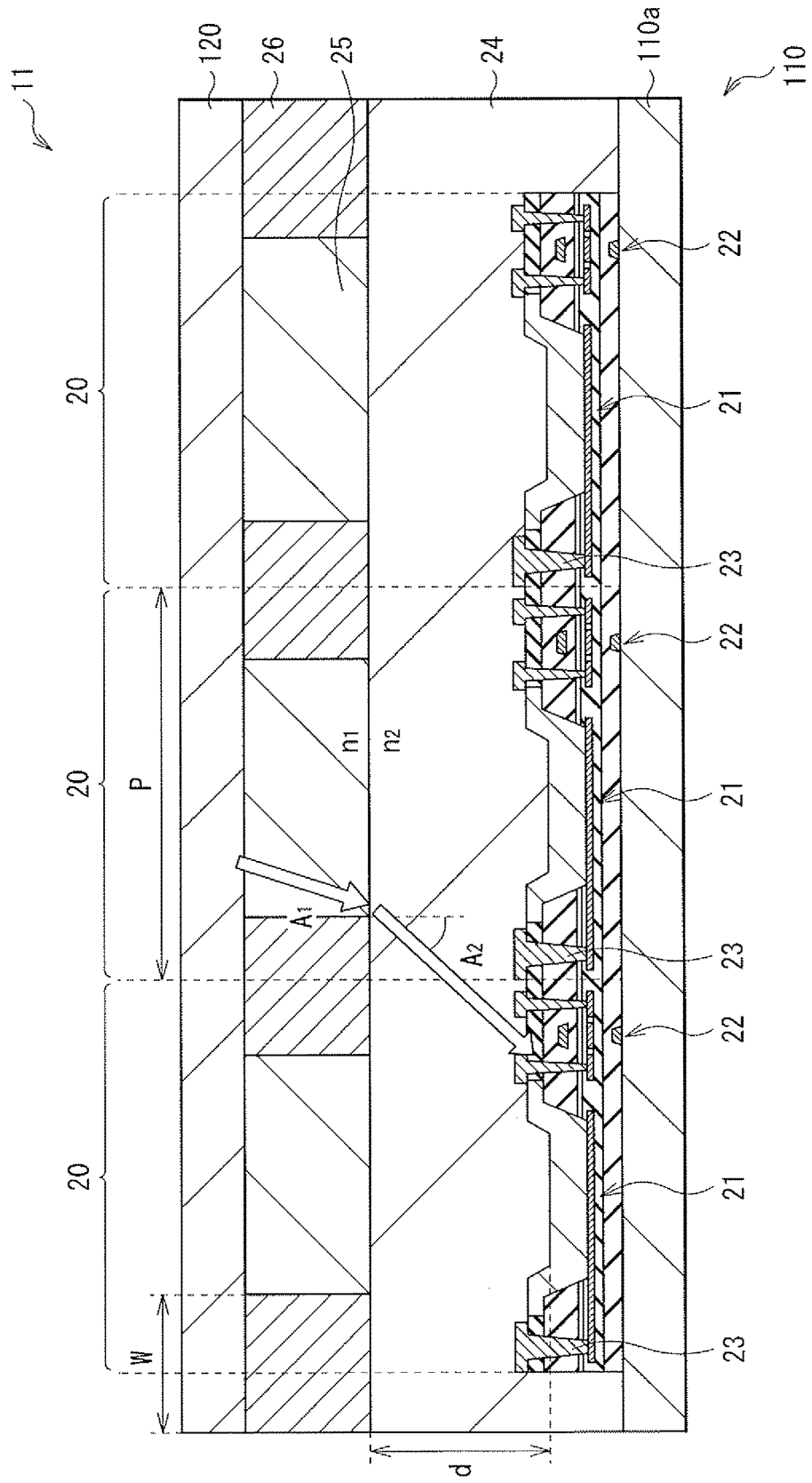

[Fig. 4]
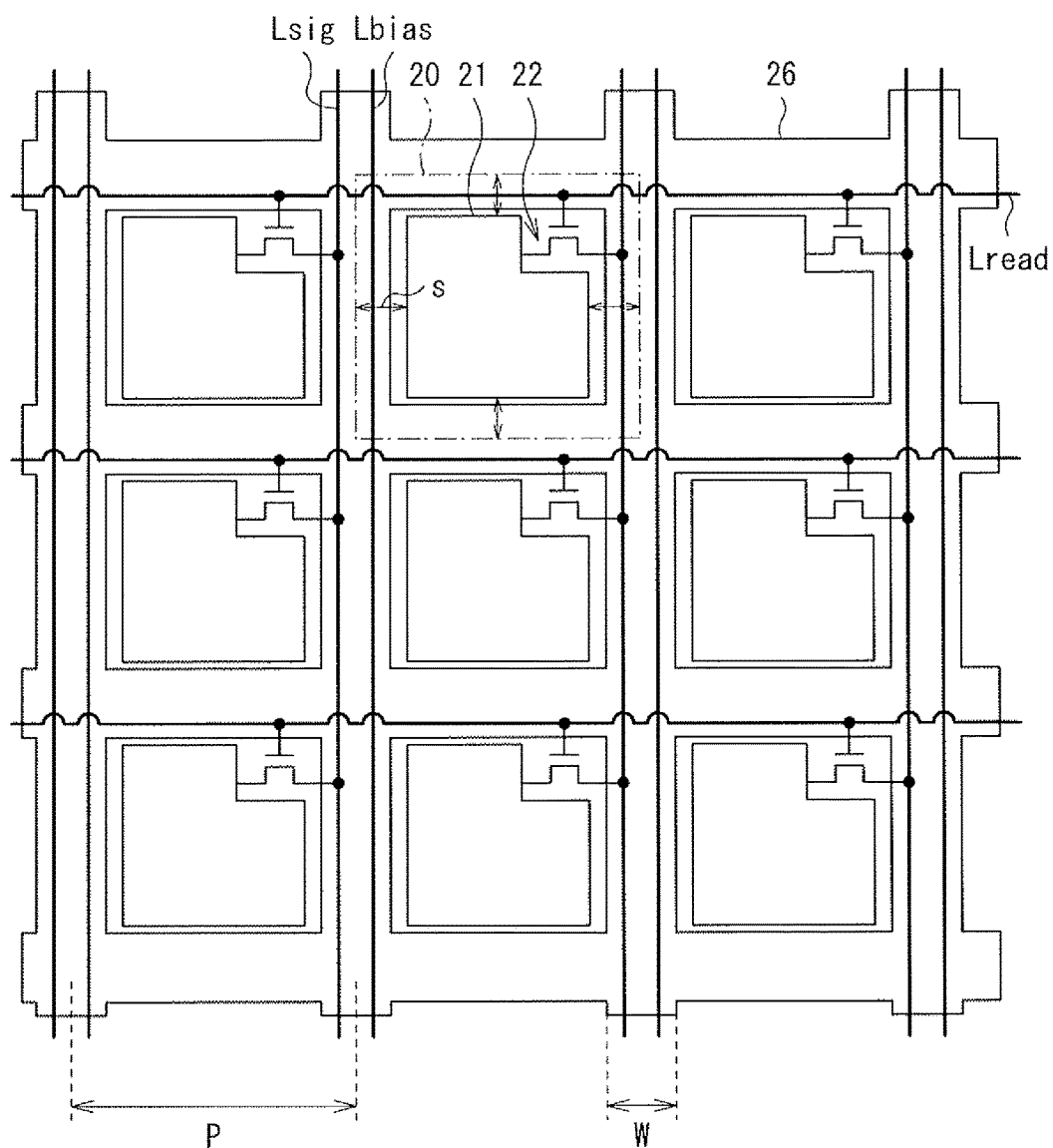

[Fig. 5]
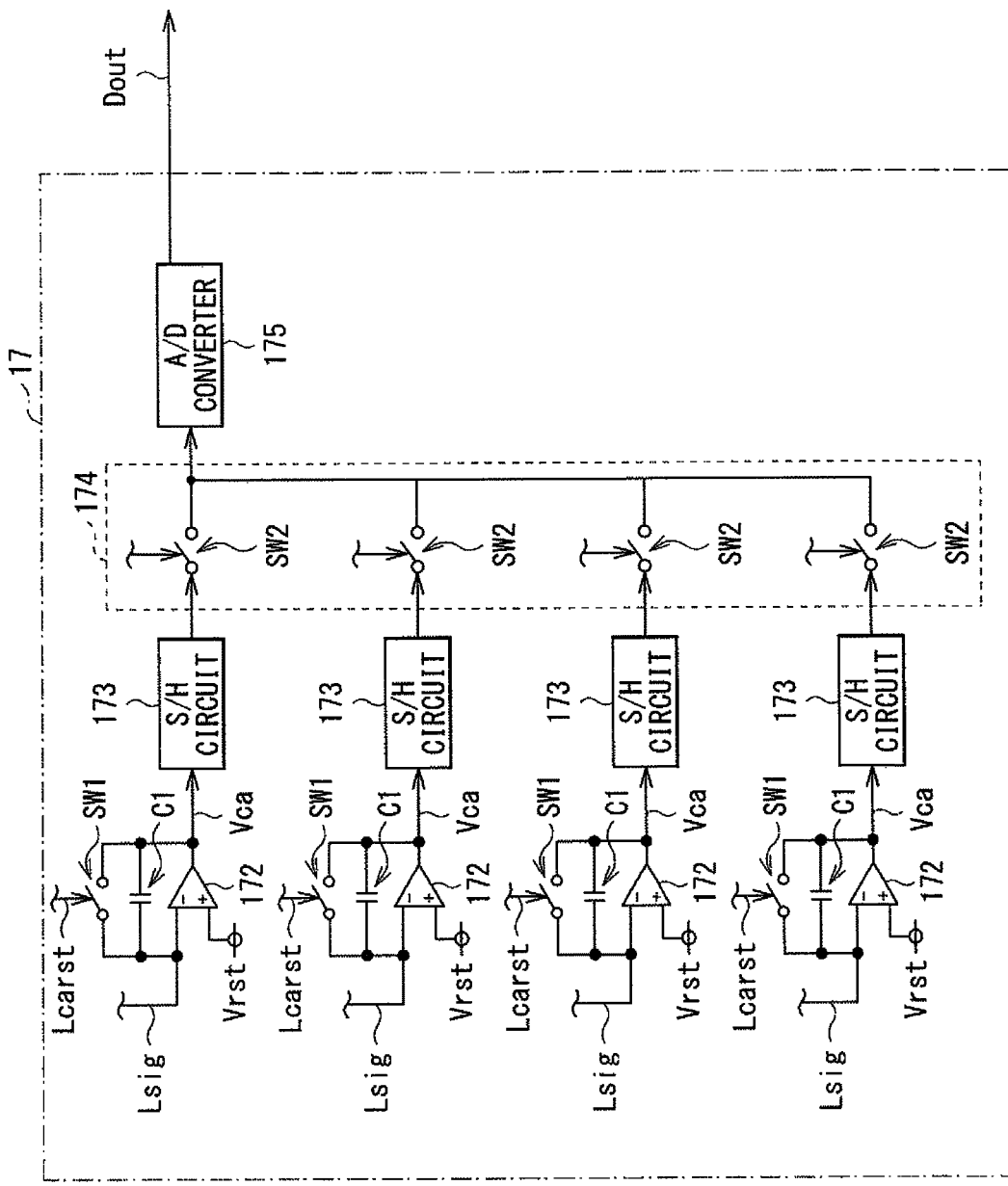

[Fig. 6]
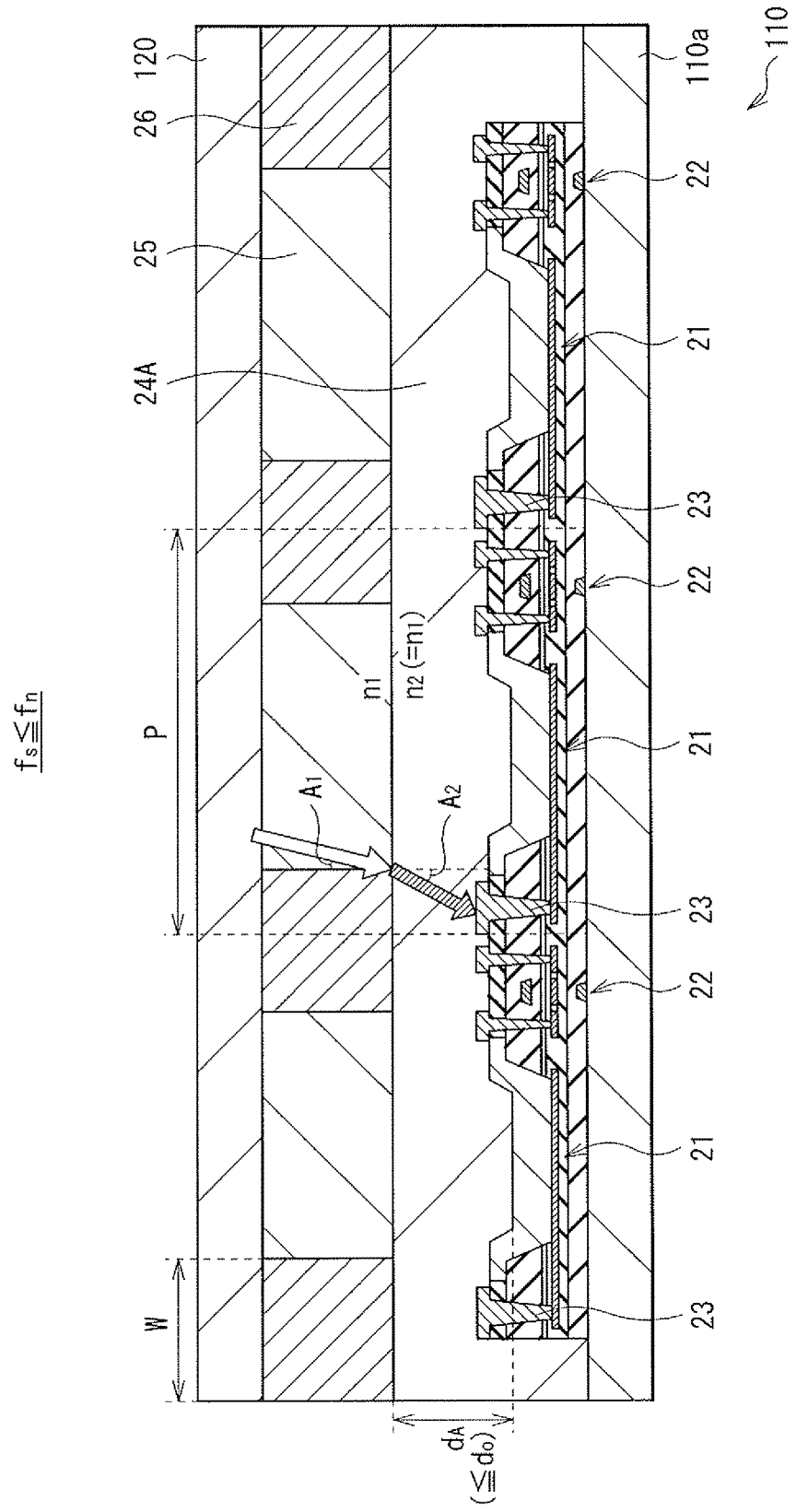

[Fig. 7A]
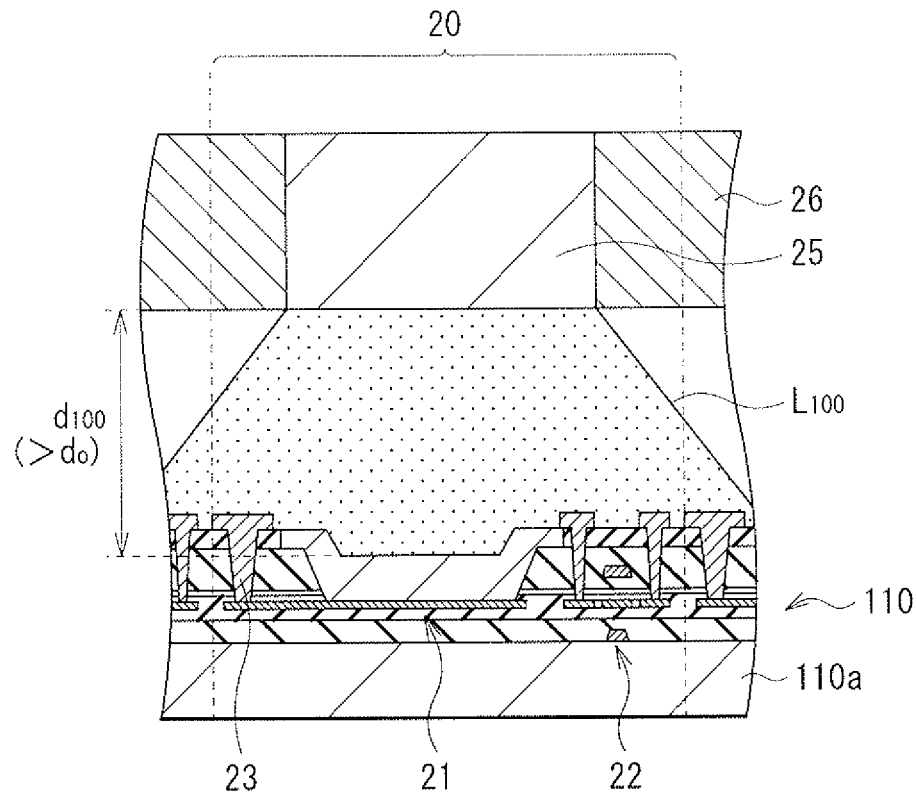
[Fig. 7B]
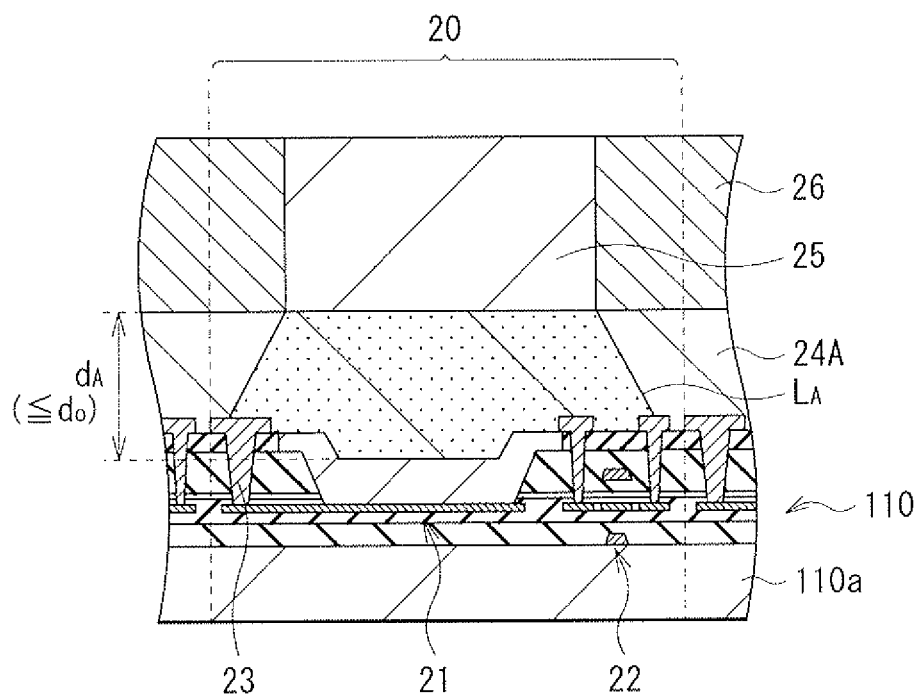

[Fig. 8]
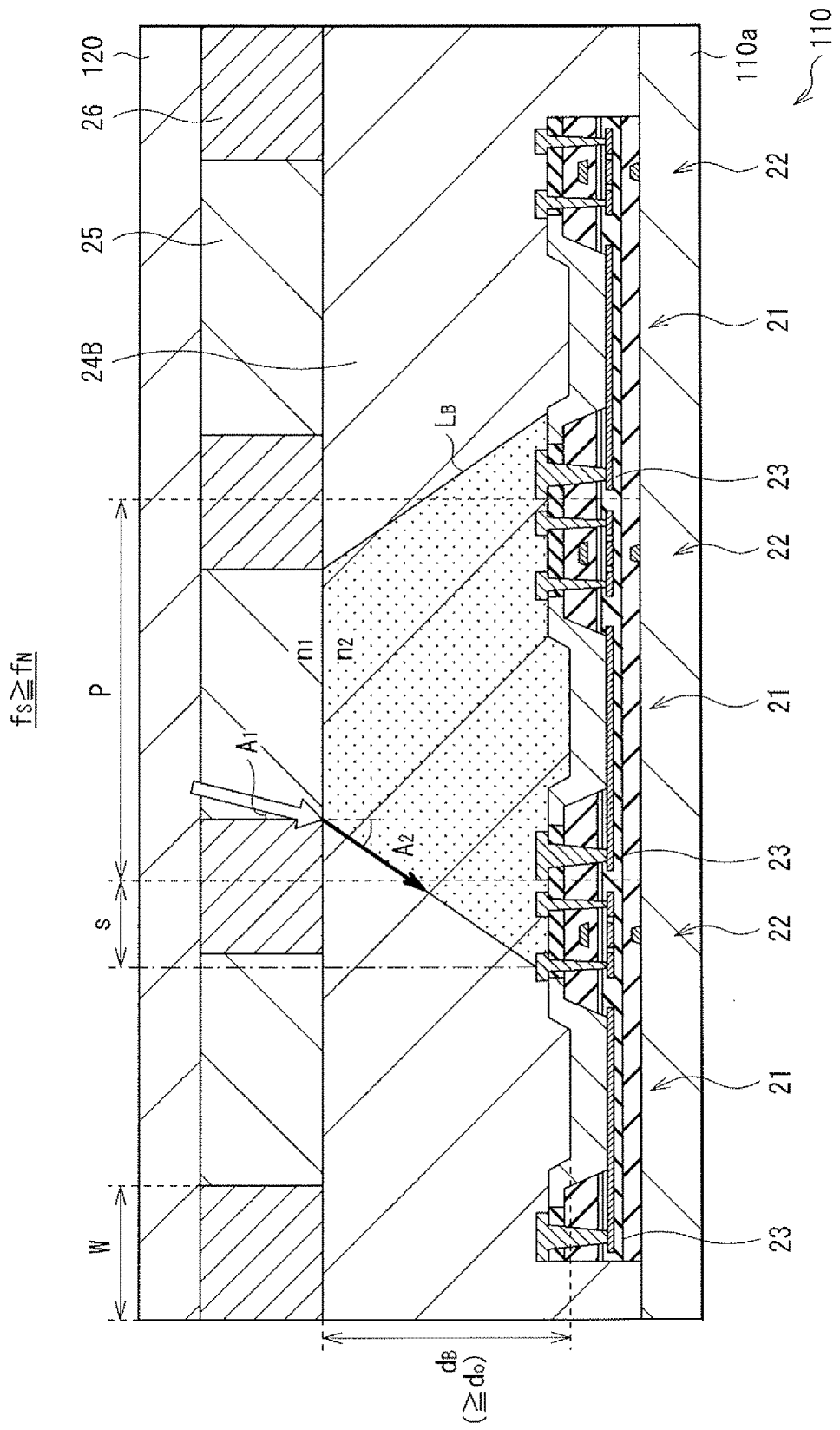

[Fig. 9A]
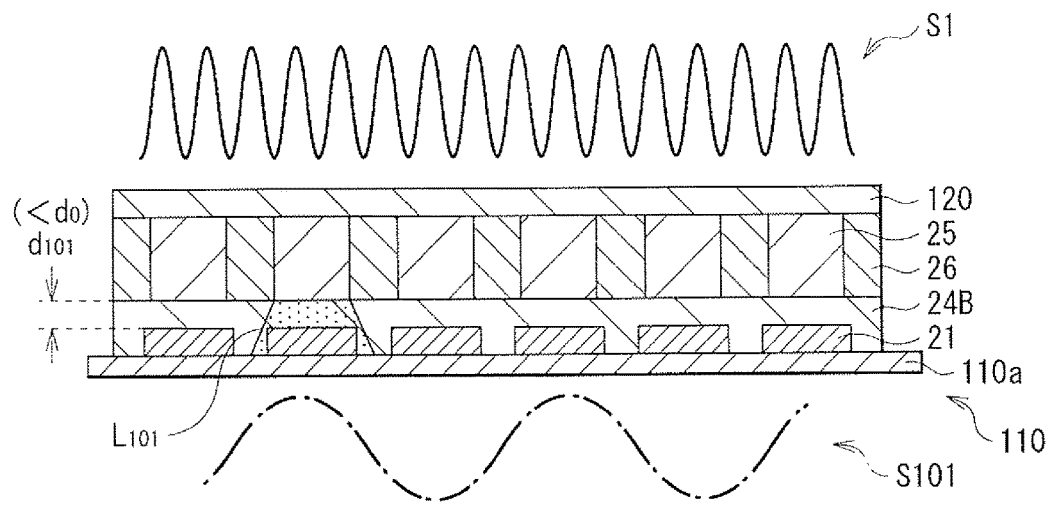
[Fig. 9B]
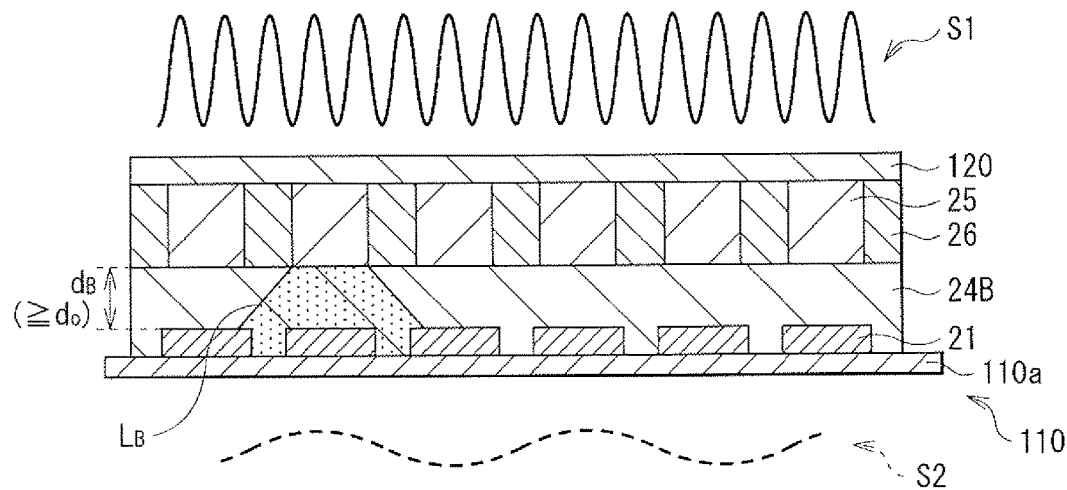

[Fig. 10]
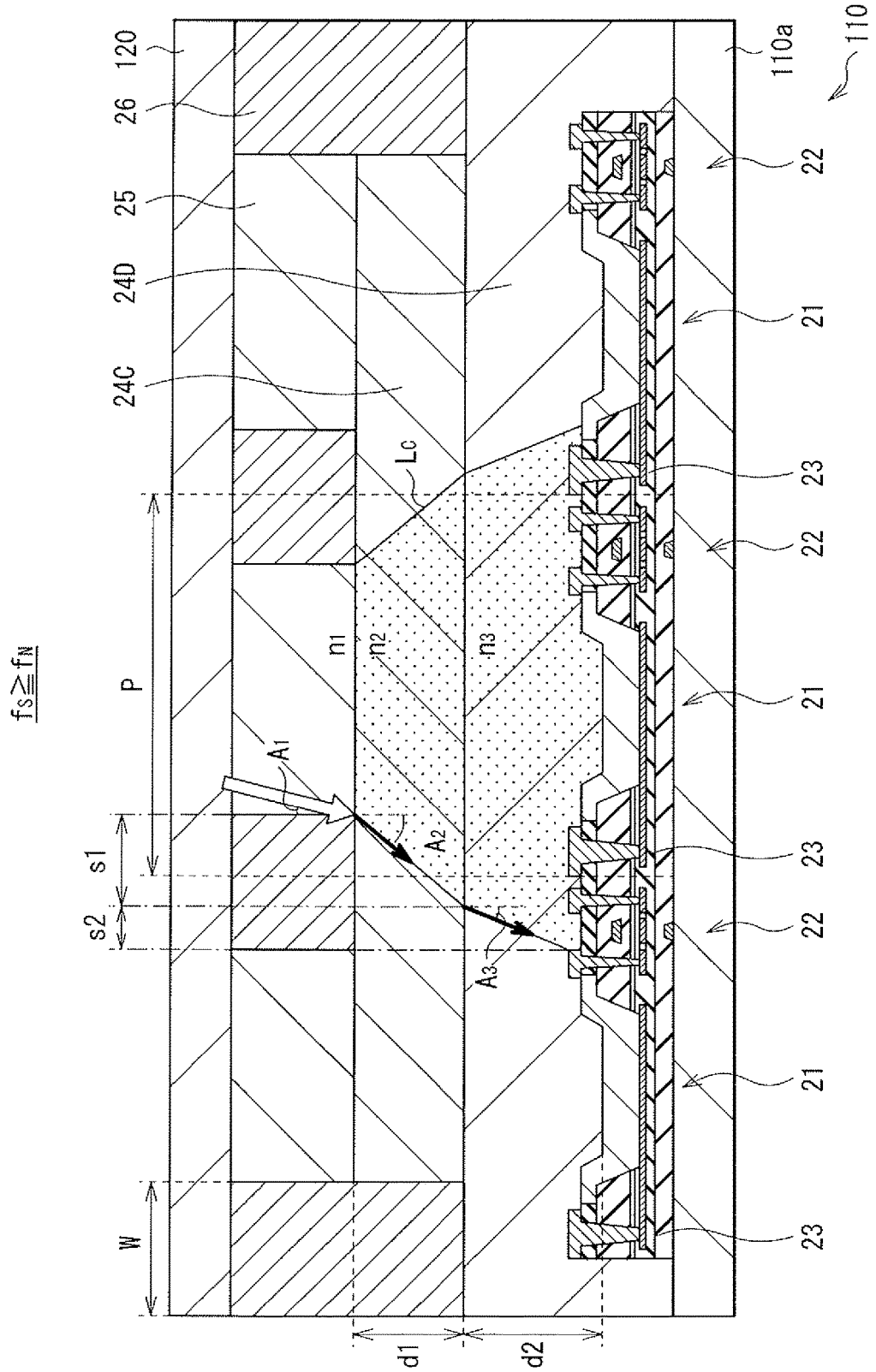

[Fig. 11]
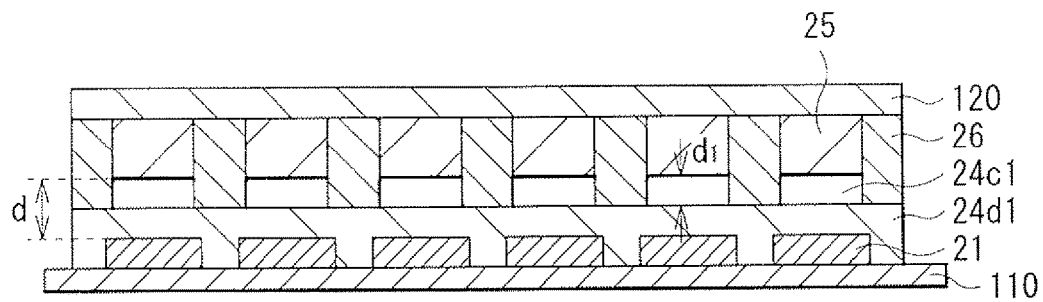
[Fig. 12]
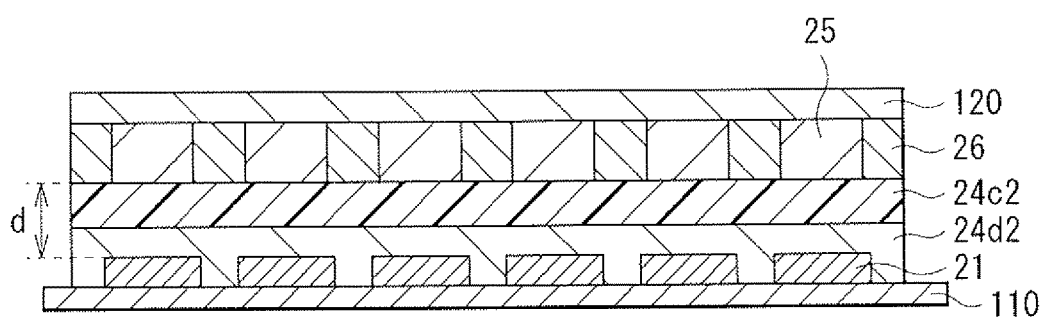
[Fig. 13]
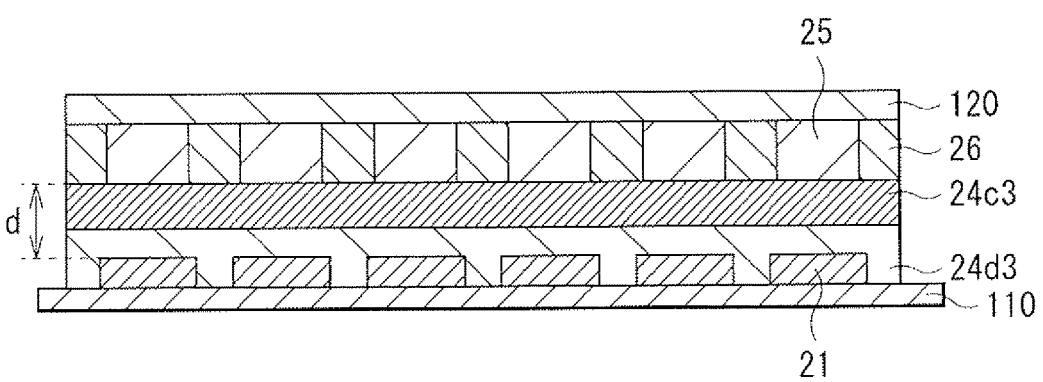

[Fig. 14]
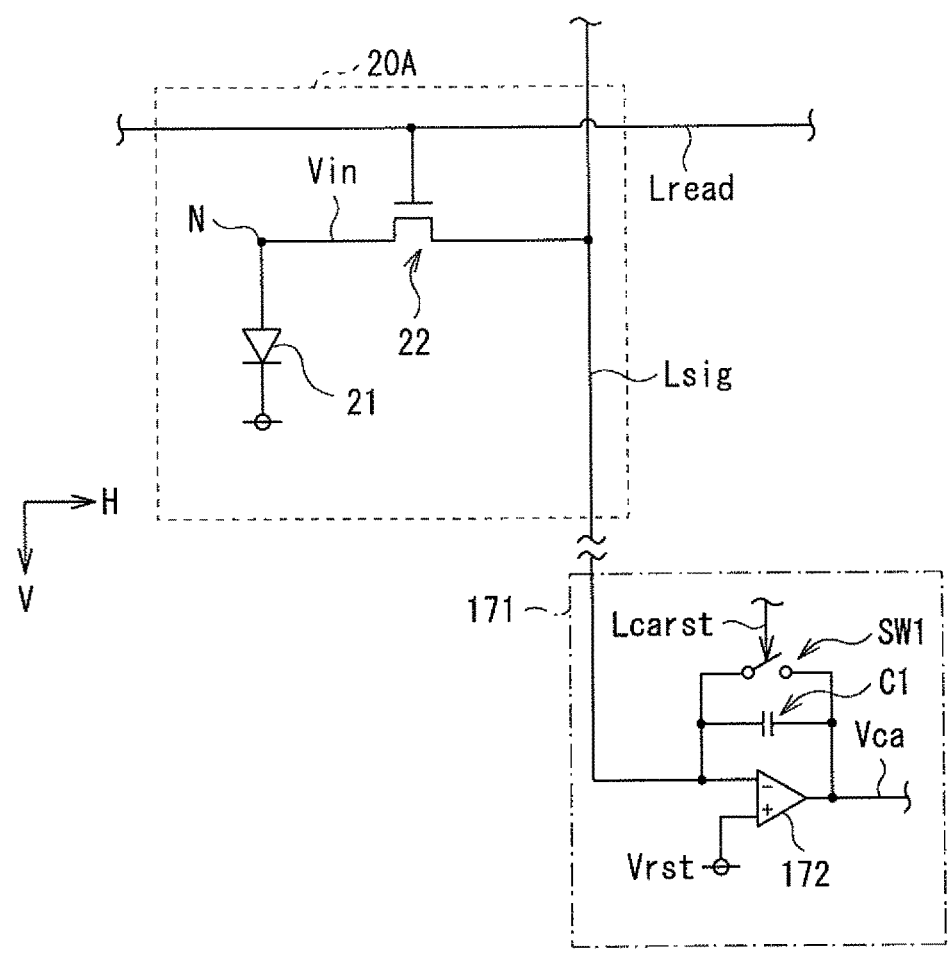

[Fig. 15]
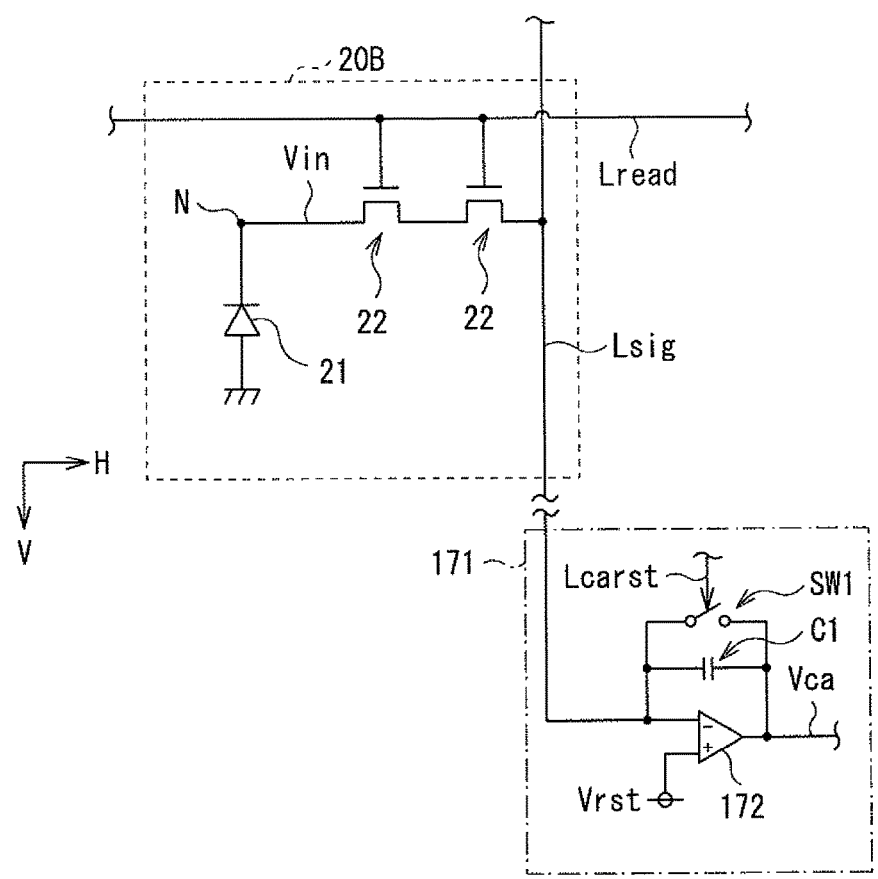

[Fig. 16]
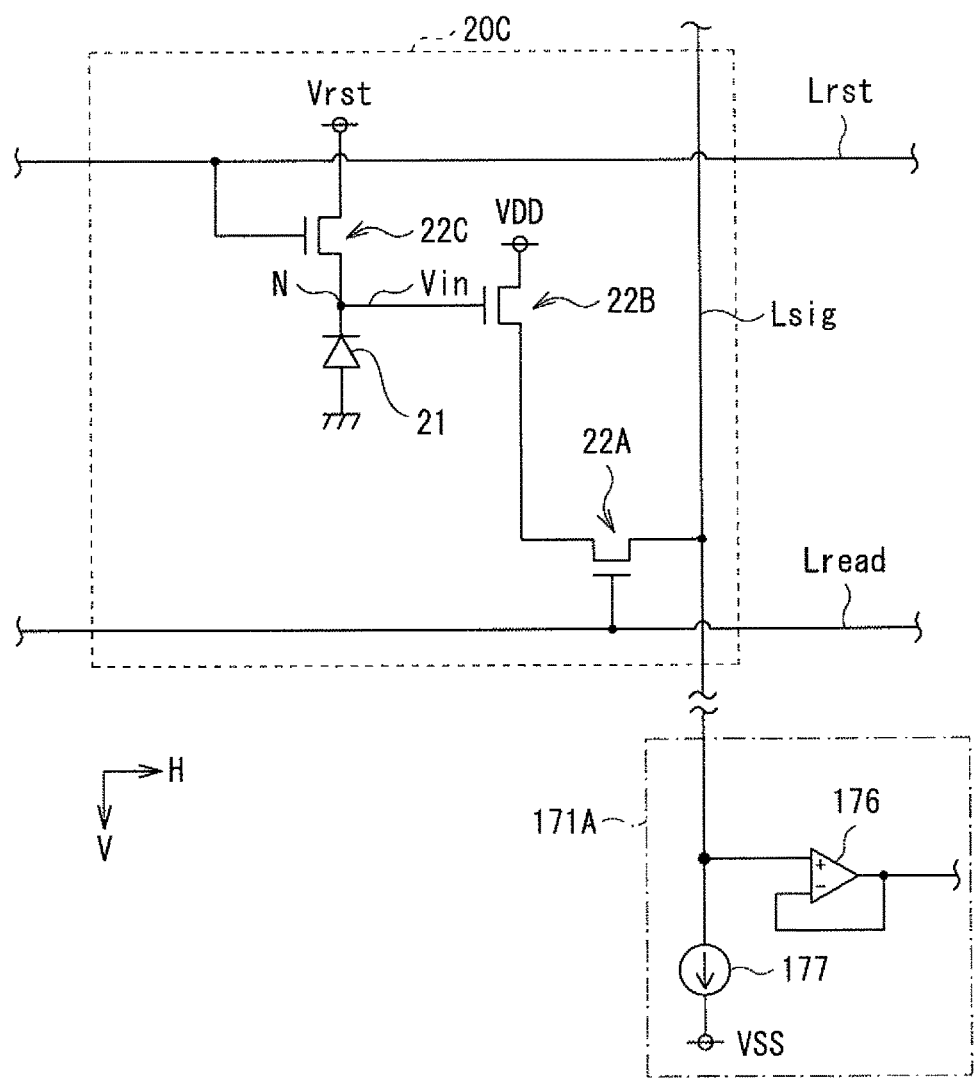

[Fig. 17]
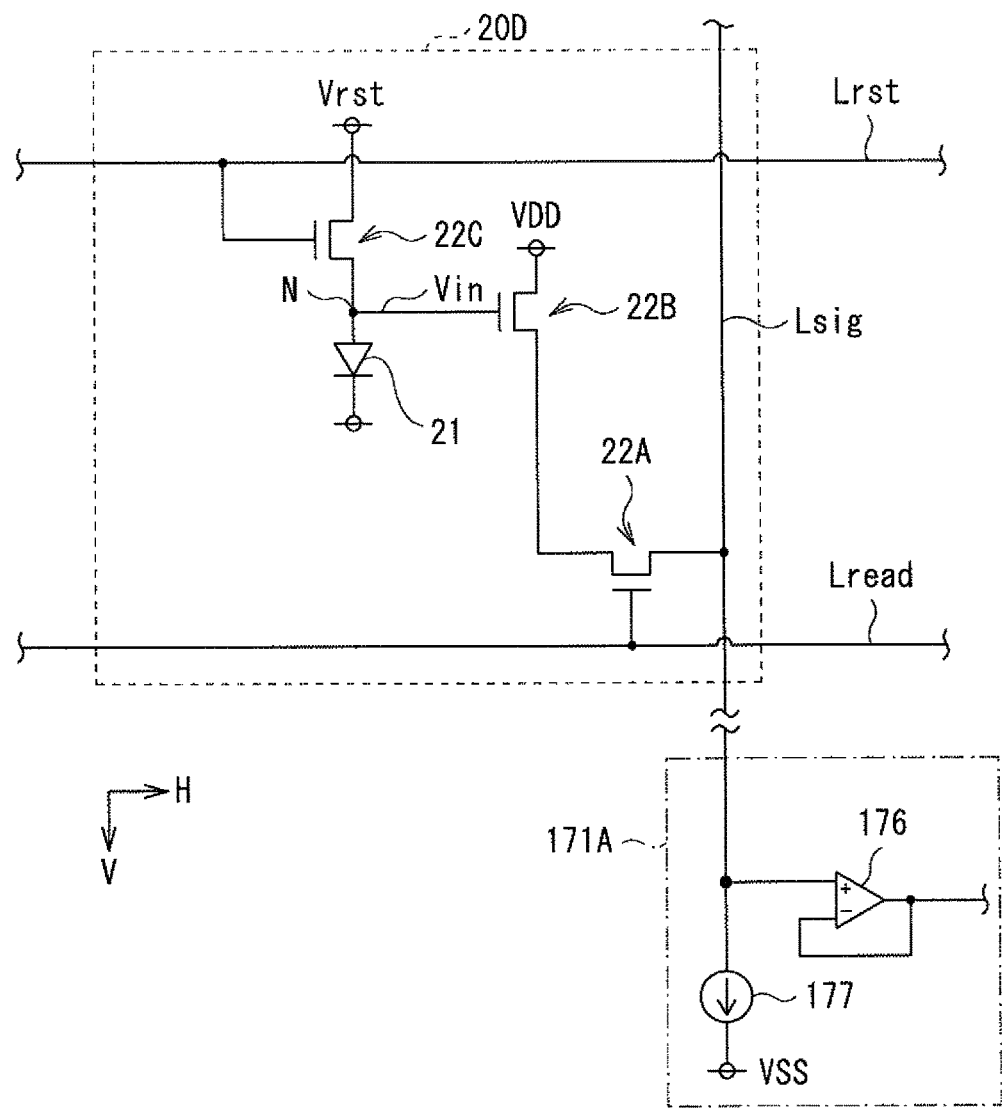

[Fig. 18]
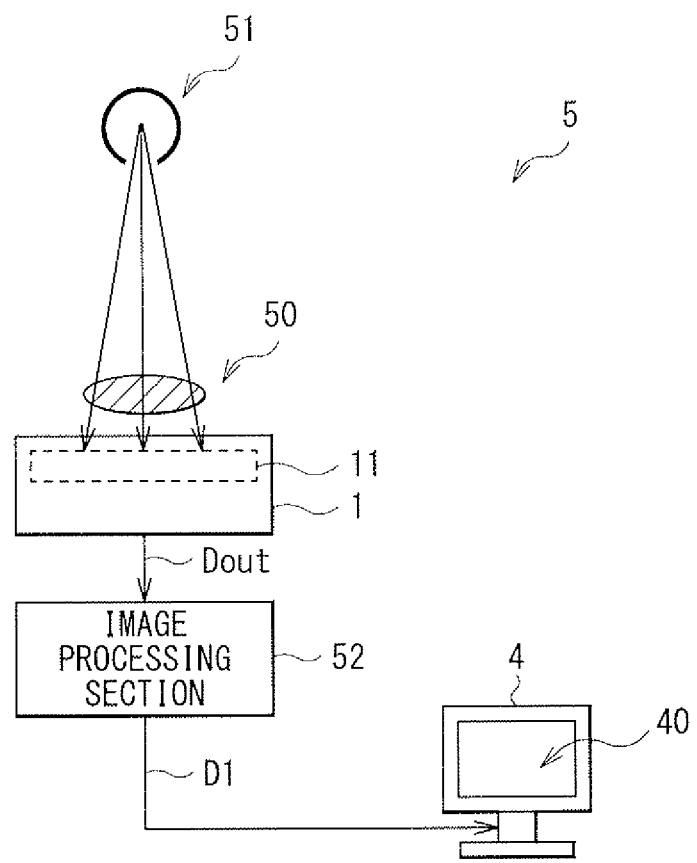

RADIATION IMAGE PICKUP UNIT AND RADIATION IMAGE PICKUP DISPLAY SYSTEM

CROSS REFERENCE TO RELATED APPLICATIONS

This application claims the benefit of Japanese Priority Patent Application JP 2013-153318 filed Jul. 24, 2013, the entire contents of which are incorporated herein by reference.

TECHNICAL FIELD

The present disclosure relates to a radiation image pickup unit acquiring an image based on incident radiations, and to a radiation image pickup display system provided with such a radiation image pickup unit.

BACKGROUND ART

In recent years, a radiation image pickup unit that acquires an image based on radiations such as X-rays, as an electric signal has been developed (for example, PTL 1). Such a radiation image pickup unit is roughly classified into so-called indirect conversion type and direct conversion type. In the indirect conversion type radiation image pickup unit, for example, a wavelength conversion substrate (a scintillator plate) including a conversion layer that converts X-rays into visible light and a sensor substrate including a photoelectric conversion element that generates an electric signal based on visible light may be bonded to each other.

CITATION LIST

Patent Literature

[PTL 1]
JP 2002-228757

SUMMARY

Technical Problem

In the radiation image pickup unit described above, a device structure that is capable of optimizing a gap between the sensor substrate and the conversion substrate to improve image quality of a picked-up image is desirably achieved.

It is desirable to provide a radiation image pickup unit capable of improving image quality of a picked-up image, and a radiation image pickup display system provided with such a radiation image pickup unit.

Solution to Problem

According to an embodiment of the disclosure, there is provided a radiation image pickup unit including: a plurality of pixels each configured to generate a signal charge based on a radiation; a device substrate including a photoelectric conversion element for each pixel; a wavelength conversion layer provided on a light incident side of the device substrate, and configured to convert a wavelength of the radiation into other wavelength; and a partition wall separating the wavelength conversion layer for each pixel. The radiation image pickup unit is configured to allow a gap between the wavelength conversion layer and the device substrate to be equal to or larger than a threshold or equal to or smaller than the threshold, the threshold being preset based on a spatial frequency of an image pickup target.

According to an embodiment of the disclosure, there is provided a radiation image pickup display system provided with a radiation image pickup unit and a display unit configured to perform image display based on an image pickup signal that is obtained by the radiation image pickup unit. The radiation image pickup unit includes: a plurality of pixels each configured to generate a signal charge based on a radiation; a device substrate including a photoelectric conversion element for each pixel; a wavelength conversion layer provided on a light incident side of the device substrate, and configured to convert a wavelength of the radiation into other wavelength; and a partition wall separating the wavelength conversion layer for each pixel. The radiation image pickup unit is configured to allow a gap between the wavelength conversion layer and the device substrate to be equal to or larger than a threshold or equal to or smaller than the threshold, the threshold being preset based on a spatial frequency of an image pickup target.

In the radiation image pickup unit and the radiation image pickup display system according to the respective embodiments of the disclosure, the gap between the device substrate having the photoelectric conversion element for each pixel and the wavelength conversion layer is configured so as to be equal to or larger than the predetermined threshold or equal to or smaller than the threshold, based on the spatial frequency of the image pickup target. Therefore, the gap between the device substrate and the wavelength conversion layer is optimized based on the spatial frequency of the image pickup target, reduction in MTF (sharpness) of a picked-up image is suppressed, and occurrence of moire and the like are suppressed.

Advantageous Effects of Invention

In the radiation image pickup unit and the radiation image pickup display system according to the respective embodiments of the disclosure, the gap between the device substrate having the photoelectric conversion element for each pixel and the wavelength conversion layer converting the wavelength of the radiation into other wavelength is configured so as to be equal to or larger than the predetermined threshold or equal to or smaller than the threshold, based on the spatial frequency of the image pickup target. Therefore, the gap between the device substrate and the wavelength conversion layer is optimized, and reduction in MTF of a picked-up image or occurrence of moire and the like are allowed to be suppressed. Consequently, it is possible to improve image quality of the picked-up image.

It is to be understood that both the foregoing general description and the following detailed description are exemplary, and are provided to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 is a block diagram illustrating an entire configuration example of a radiation image pickup unit according to an embodiment of the disclosure.

FIG. 2 is a circuit diagram illustrating a detailed configuration example of a pixel and the like illustrated in FIG. 1.

FIG. 3 is a sectional diagram illustrating a structure of the pixel section illustrated in FIG. 1.

FIG. 4 is a planar schematic diagram illustrating the pixel section illustrated in FIG. 3.

FIG. 5 is a block diagram illustrating a detailed configuration example of a column selection section illustrated in FIG. 1.

FIG. 6 is a sectional diagram illustrating a structure of a pixel section according to a first embodiment of the disclosure.

FIG. 7A is a schematic diagram for explaining a function of a pixel section according to a comparative example 1.

FIG. 7B is a schematic diagram for explaining a function of the pixel section illustrated in FIG. 6.

FIG. 8 is a sectional diagram illustrating a structure of a pixel section according to a second embodiment of the disclosure.

FIG. 9A is a schematic diagram for explaining a function of a pixel section according to a comparative example 2.

FIG. 9B is a schematic diagram for explaining a function of the pixel section illustrated in FIG. 8.

FIG. 10 is a sectional diagram illustrating a structure of a pixel section according to a third embodiment of the disclosure.

FIG. 11 is a sectional diagram illustrating a structure of a main part of a pixel section according to a modification 1-1.

FIG. 12 is a sectional diagram illustrating a structure of a main part of a pixel section according to a modification 1-2.

FIG. 13 is a sectional diagram illustrating a structure of a main part of a pixel section according to a modification 1-3.

FIG. 14 is a circuit diagram illustrating a configuration of a pixel and the like according to a modification 2.

FIG. 15 is a circuit diagram illustrating a configuration of a pixel and the like according to a modification 3.

FIG. 16 is a circuit diagram illustrating a configuration of a pixel and the like according to a modification 4-1.

FIG. 17 is a circuit diagram illustrating a configuration of a pixel and the like according to a modification 4-2.

FIG. 18 is a schematic diagram illustrating a schematic configuration of a radiation image pickup display system according to an application example.

DESCRIPTION OF EMBODIMENTS

Hereinafter, preferred embodiments of the present disclosure will be described in detail with reference to drawings. Note that description will be given in the following order.
1. Entire configuration (a configuration example of a radiation image pickup unit and a pixel section)
2. First embodiment (an example in which a gap between a device substrate and a wavelength conversion layer is optimized in a case where a spatial frequency of an image pickup target is equal to or lower than Nyquist frequency)
3. Second embodiment (an example in which a gap between a device substrate and a wavelength conversion layer is optimized in a case where a spatial frequency of an image pickup target is equal to or higher than Nyquist frequency)
4. Third embodiment (an example in a case where two intermediate layers different in refractive index from each other are interposed between a device substrate and a wavelength conversion layer)
5. Modification 1-1 (another example in a case where two intermediate layer are interposed)
6. Modification 1-2 (another example in a case where two intermediate layers are interposed)
7. Modification 1-3 (another example in a case where two intermediate layers are interposed)
8. Modification 2 (an example of another passive pixel circuit)
9. Modification 3 (an example of another passive pixel circuit)
10. Modifications 4-1 and 4-2 (examples of an active pixel circuit)
11. Application example (an example of a radiation image pickup display system)

<Entire Configuration>

FIG. 1 illustrates a block configuration of an entire radiation image pickup unit (a radiation image pickup unit 1) according to an embodiment of the disclosure. Here, before description of first to third embodiments described later, a configuration common to the respective embodiments is described. The radiation image pickup unit 1 reads information of an object (picks up an image of the object) based on incident radiations (for example, X-rays). The radiation image pickup unit 1 includes a pixel section 11, and includes a row scan section 13, an A/D conversion section 14, a column scan section 15, and a system control section 16 that serve as a drive circuit of the pixel section 11. The radiation image pickup unit 1 may be, for example, an indirect conversion type flat panel detector (FPD). Although the detail will be described later, in the pixel section 11, after the radiations are converted into visible light once, an electric signal based on the visible light is allowed to be obtained.

(Pixel Section 11)

The pixel section 11 includes a plurality of pixels (image pickup pixels and unit pixels) 20 each generating a signal charge based on the radiation. The plurality of pixels 20 are two-dimensionally arranged in a matrix. Note that, as illustrated in FIG. 1, a horizontal direction (a row direction) in the pixel section 11 is referred to as "H" direction, and a vertical direction (a column direction) is referred to as "V" direction.

FIG. 2 exemplifies a circuit configuration (a so-called passive circuit configuration) of the pixel 20 together with a circuit configuration of a charge amplifier circuit 171 (described later) in the A/D conversion section 14. For example, one photoelectric conversion element 21 and one TFT 22 may be provided in the passive pixel 20. In addition, a readout control line Lread (a scan line, or a gate line) extending along the H direction, and a signal line Lsig extending along the V direction are connected to the pixel 20.

For example, the photoelectric conversion element 21 may be configured of a positive intrinsic negative (PIN) type photodiode, or a metal-insulator-semiconductor (MIS) type sensor, and generates signal charges of an amount corresponding to an incident light amount. Incidentally, a cathode of the photoelectric conversion element 21 is connected to a storage node N in this case, and for example, an anode thereof may be grounded or may be connected to a bias line.

The TFT 22 is a transistor (a readout transistor) that is put into an ON state in response to a row scan signal supplied from the readout control line Lread to output the signal charges (an input voltage Vin) obtained by the photoelectric conversion element 21 to the signal line Lsig. The TFT 22 may be configured of, for example, an N-channel (an N-type) field effect transistor (FET). However, the TFT 22 may be configured of a P-channel (a P-type) FET, or the like.

For example, the TFT 22 may have a so-called dual gate type (double-surface gate type, or double gate type) device structure in which two gate electrodes are disposed to face each other with a semiconductor layer (an active layer) in between. Alternatively, the TFT 22 may have a bottom gate type device structure or a top gate type device structure. The semiconductor layer of the TFT 22 may be configured of, for example, a silicon-based semiconductor such as amorphous silicon, microcrystalline silicon, and polycrystalline silicon (poly-silicon), and desirably formed of low-temperature poly-silicon (LTPS). However, the material of the TFT 22 is not limited to these silicon-based semiconductors, and the TFT 22 may be configured of, for example, an oxide semiconductor such as indium gallium zinc oxide (In-GaZnO) and zinc oxide (ZnO).

FIG. 3 illustrates a sectional-surface structure of the pixel section 11 configured of the pixels 20 as described above. FIG. 4 schematically illustrates a planar structure of the pixel section 11. The pixel section 11 includes a wavelength conversion layer 25 on a light incident side (a light receiving surface side) of a device substrate (a sensor substrate) 110. The wavelength conversion layer 25 is separated by a partition wall 26 for each pixel 20. For example, the wavelength conversion layer 25 and the partition wall 26 may be formed on one surface of a supporting substrate 120, and configure a wavelength conversion substrate (a scintillator plate). In the pixel section 11, for example, the supporting substrate 120 and the device substrate 110 may be bonded to each other with the wavelength conversion layer 25 and the partition wall 26 in between. In respective embodiments described below, one or a plurality of intermediate layers (intermediate layers 24) are interposed between the device substrate 110 and the wavelength conversion layer 25. Incidentally, although the structure in which three pixels 20 are arranged is illustrated in FIG. 3 for simplification, the number of pixels and pixel arrangement of the pixel section 11 are not limited thereto.

The device substrate 110 includes the above-described photoelectric conversion element 21 and the above-described TFT 22 formed on a substrate 110a of glass or the like, and includes a wiring 23 and the like. For example, the wiring 23 corresponds to the readout control line Lread, the signal line Lsig, a bias line (Lbias), and the like. In the device substrate 110, for example, the photoelectric conversion element 21, the TFT 22, and the wiring 23 (Lead, Lsig, and Lbias) may be arranged as illustrated in FIG. 4. For example, the readout control line Lread and the signal line Lsig may be arranged so as to intersect with each other and to face the partition wall 26. Moreover, for example, the bias line Lbias may be arranged in parallel to the signal line Lsig. The TFT 22 is formed adjacent to (or close to) the readout control line Lread and the signal line Lsig in order to reduce noise and to suppress reduction in fill factor. The photoelectric conversion element 21 is formed in a region surrounded by the readout control line Lread, the signal line Lsig, the bias line Lbias, and the TFT 22.

The partition wall 26 is formed in a region between the respective pixels 20, and separates the wavelength conversion layer 25 for each pixel. In other words, the partition wall 26 may have a lattice shape as illustrated in FIG. 4, for example, and the wavelength conversion layer 25 is filled in parts (opening parts) surrounded by the lattice. Such a partition wall 26 may be formed of, for example, photosensitive glass (for example, a mixture of ceramic powder and low-melting-point glass). A thickness (a height) of the partition wall 26 may be, for example, about 0.1 mm to about 0.3 mm both inclusive, and a width (a width w) of the partition wall 26 may be, for example, about 0.02 mm to about 0.06 mm both inclusive.

The wavelength conversion layer 25 converts a wavelength of the radiation Rrad (for example, an α-ray, a β-ray, a tray, and an X-ray) into a wavelength in a sensitive range of the photoelectric conversion element 21, and may be formed of, for example, fluorescent substance (for example, scintillator) that absorbs the X-ray to emit visible light. Examples of the material of the fluorescent substance may include, for example, CsI (added with Tl), $Gd_2O_2S$, BaFX (X is Cl, Br, I, or the like), NaI, and $CaF_2$. The thickness of the wavelength conversion layer 25 is equivalent to or smaller than the thickness (the height) of the partition wall 26.

The supporting substrate 120 may be formed of, for example, glass, ceramics, semiconductors, metals, polymer materials, or the like. For example, plate glass such as quartz, borosilicate glass, and chemically reinforced glass, ceramics such as sapphire, silicon nitride, and silicon carbide, semiconductors such as silicon, germanium, gallium arsenide, gallium phosphide, and gallium nitride, metals such as aluminum (Al), iron (Fr), and copper (Cu), and these metals covered with a metal oxide thereof, and the like may be used. Moreover, polymer materials (plastic) such as polyester, polyethylene terephthalate, polyamide, polyimide, and a carbon fiber reinforced resin may be used.

The intermediate layer 24 may be provided, for example, over the entire surface of the device substrate 110 between the device substrate 110 and the wavelength conversion layer 25 as described above. Although detail will be described later, the intermediate layer 24 may be formed of a predetermined material or may be an air layer. The intermediate layer 24 defines a distance (a gap d) between the device substrate 110 and the wavelength conversion layer 25. Appropriately setting the refractive index, the film thickness, and the like of the intermediate layer 24 makes it possible to optimize the gap d based on the spatial frequency (fs) of the image pickup target in each of the embodiments described below. Note that, more specifically, the gap d corresponds to a distance between the light receiving surface of the photoelectric conversion element 21 of the device substrate 110 and a light emission surface of the wavelength conversion layer 25.

Specifically, the distance d is set so as to be equal to or smaller than a preset threshold do or to be equal to or larger than the threshold do based on the spatial frequency fs. The threshold do is a size of the gap at the time when light emitted from the wavelength conversion layer 25 enters an end (a boundary between a light receiving region and a non-light receiving region) of the photoelectric conversion element 21 of an adjacent pixel. In other words, the threshold do is represented by the following expressions (1) and (2). Incidentally, s is a value corresponding to a minimum value of a distance between the end of the photoelectric conversion element 21 and an end of the pixel 20 (see FIG. 4). Moreover, $A_1$ represents an incident angle (a maximum value) to an interface between the wavelength conversion layer 25 and the intermediate layer 24, $A_2$ represents a refraction angle at the interface between the wavelength conversion layer 25 and the intermediate layer 24, $n_1$ represents a refractive index of the wavelength conversion layer 25, and $n_2$ represents a refractive index of the intermediate layer 24.

[Math. 1]

$$do = \frac{\left(s + \frac{w}{2}\right)}{\tan A_2} \quad (1)$$

$$A_2 = \sin^{-1}\left(n_1 \cdot \frac{\sin A_1}{n_2}\right) \quad (2)$$

Examples of the parameters and the threshold $d_O$ may be $A_1=20$ degrees (+20 degrees or −20 degrees). When $A_1$ exceeds 20 degrees, visible light is difficult to be emitted to the outside of the wavelength conversion layer 25 due to attenuation by reflection at the partition wall 26. Moreover, the parameters may be set as follows: $n_1=2.2$, $n_2=1.5$, $s=10$ micrometers, and $w=25$ micrometers. When the parameters are set in this way, $d_O$ becomes 38.8 micrometers.

(Row Scan Section 13)

The row scan section 13 is a pixel drive section (a row scan circuit) that includes a shift resister circuit, a predetermined logical circuit, and the like that are described later, and performs driving (linear sequential scanning) of the plurality of pixels 20 in the pixel section 11 on a row basis (on a horizontal line basis). Specifically, the row scan section 13 may perform image pickup operation such as readout operation and reset operation of the pixels 20, for example, through the linear sequential scanning. Note that the linear sequential scanning is performed by supplying the row scan signal described above to the pixels 20 through the readout control line Lread.

(A/D Conversion Section 14)

The A/D conversion section 14 includes a plurality of column selection sections 17 each provided for a plurality of (four, in this case) signal lines Lsig. The A/D conversion section 14 performs A/D conversion (analog to digital conversion) based on a signal voltage (a voltage corresponding to the signal charge) input through the signal lines Lsig. Output data Dout (an image pickup signal) formed of digital signals is generated accordingly, and is output to the outside.

For example, as illustrated in FIG. 5, each of the column selection sections 17 includes charge amplifiers 172, capacitors (for example, feedback capacitors, or the like) C1, switches SW1, sample and hold (S/H) circuits 173, a multiplexer circuit (a selection circuit) 174 including four switches SW2, and an A/D converter 175. Among them, the charge amplifier 172, the capacitor C1, the switch SW1, the S/H circuit 173, and the switch SW2 are provided one by one for each signal line Lsig. Note that, among them, the charge amplifier 172, the capacitor C1, and the switch SW1 correspond to the charge amplifier circuit 171 illustrated in FIG. 2. The multiplexer circuit 174 and the A/D converter 175 are provided for each column selection section 17.

The charge amplifier 172 is an amplifier converting the signal charges read out from the signal line Lsig into a voltage (Q-V conversion). In the charge amplifier 172, an input terminal on a negative side (a minus side) is connected to an end of the signal line Lsig, and an input terminal on a positive side (a plus side) receives a predetermined reset voltage Vrst. An output terminal of the charge amplifier 172 and the input terminal on the negative side are feedback connected through a parallel connection circuit of the capacitor C1 and the switch SW1. In other words, a first terminal of the capacitor C1 is connected to the input terminal on the negative side of the charge amplifier 172, and a second terminal thereof is connected to the output terminal of the charge amplifier 172. Likewise, a first terminal of the switch SW1 is connected to the input terminal on the negative side of the charge amplifier 172, and a second terminal thereof is connected to the output terminal of the charge amplifier 172. Note that the ON-OFF state of the switch SW1 is controlled by the control signal (an amplifier reset control signal) supplied from the system control section 16 through an amplifier reset control line Lcarst.

The S/H circuit 173 is a circuit that is disposed between the charge amplifier 172 and the multiplexer circuit 174 (the switch SW2), and temporarily holds an output voltage Vca from the charge amplifier 172.

The multiplexer circuit 174 is a circuit that selectively connects or blocks between each of the S/H circuits 173 and the A/D converter 175 when one of the four switches SW2 is sequentially put into ON state in response to scan drive by the column scan section 15.

The A/D converter 175 is a circuit that performs the A/D conversion on the output voltage from the S/H circuit 173, which is input through the switch SW2, to generate and output the above-described output data Dout.

(Column Scan Section 15)

The column scan section 15 may include, for example, a shift resistor, an address decoder, and the like, which are not illustrated, and scans and drives in order the switches SW2 in the column selection section 17 described above. The signals (the above-described output data Dout) of the respective pixels 20 read out through the respective signal lines Lsig are output to the outside in order by such selection scanning by the column scan section 15.

(System Control Section 16)

The system control section 16 controls operation of each of the row scan section 13, the A/D conversion section 14, and the column scan section 15. Specifically, the system control section 16 has a timing generator generating the various kinds of timing signals (control signals) described above, and performs drive control of the row scan section 13, the A/D conversion section 14, and the column scan section 15, based on the various kinds of timing signals generated by the timing generator. The row scan section 13, the A/D conversion section 14, and the column scan section 15 each perform image pickup driving (linear sequential image pickup driving) to the plurality of pixels 20 in the pixel section 11 based on the control of the system control section 16, and thus the output data Dout is acquired from the pixel section 11.

Hereinafter, in the above-described radiation image pickup unit 1, optimization of the gap d based on the spatial frequency fs will be described.

First Embodiment (Structure)

FIG. 6 illustrates a sectional-surface structure of the pixel section 11 according to a first embodiment of the disclosure. In the first embodiment, optimization of the gap d in a case where the spatial frequency fs of the image pickup target is equal to or lower than the Nyquist frequency fn (for example, ½ of a pixel pitch p) (fs<=fn). In this case, the pixel section 11 is configured so that the gap d is a value ($d_A$) equal to or smaller than the above-described threshold do. In other words, the gap $d_A$ is represented by the following expressions (A) and (2).

[Math. 2]

$$d = d_A <= \frac{\left(s + \frac{w}{2}\right)}{\tan A_2} \quad (A)$$

$$A_2 = \sin^{-1}\left(n_1 \cdot \frac{\sin A_1}{n_2}\right) \quad (2)$$

An intermediate layer 24A (a first intermediate layer) as a specific example of the above-described intermediate layer 24 is formed between the device substrate 110 and the wavelength conversion layer 25. The intermediate layer 24A may be desirably formed of, for example, the same material (scintillator) as that of the wavelength conversion layer 25. Alternatively, the intermediate layer 24A may be formed of a material different from that of the wavelength conversion layer 25; however may be desirably formed of a material that has a small refractive index difference (difference between the refractive indices $n_1$ and $n_2$) with the wavelength conversion layer 25. This is because the refraction angle $A_2$ is smaller and a design range of the gap $d_A$ is increased as compared with a case where, for example, an air layer is provided between the device substrate 110 and the wavelength conversion layer 25, and thus a process margin is expanded. Moreover, when the scintillator material as the intermediate layer 24 is powder or liquid, filling is easily performed.

(Function and Effects)

In the radiation image pickup unit 1 according to the first embodiment, for example, when the radiations such as X-rays enter the pixel section 11, the radiations are absorbed by the wavelength conversion layer 25 and visible light is emitted. The visible light is emitted from the wavelength conversion layer 25, and then is received by the pixels 20 (the photoelectric conversion elements 21) in the device substrate 110. As a result, in each pixel 20 (each photoelectric conversion element 21), signal charges based on the incident light are generated (the photoelectric conversion is performed). At this time, voltage change according to the node capacitance occurs at the storage node N (FIG. 2) by accumulation of the generated signal charges. According to the voltage change, an input voltage Vin (a voltage corresponding to the signal charges) is supplied to the drain of the TFT 22. After that, when the TFT 22 is put into the ON state in response to the row scan signal supplied from the readout control line Lread, the above-described signal charges are read to the signal line Lsig.

The signal charges read out in this way are input to the column selection section 17 in the A/D conversion section 14 for each of the plurality of (four, herein) pixel columns through the signal line Lsig. In the column selection section 17, first, the Q-V conversion (conversion from the signal charges to the signal voltage) is performed for each signal charge input from each signal line Lsig, in a charge amplifier circuit 171 configured of the charge amplifier 172 and the like. Subsequently, the A/D conversion is performed on the converted signal voltage (the output voltage Vca from the charge amplifier 172) in the A/D converter 175 through the S/H circuit 173 and the multiplexer circuit 174, to generate the output data Dout (the image pickup signal) formed of digital signals. In this way, the output data Dout is sequentially output from each column selection section 17, and is transmitted to the outside (or is input to an internal memory not illustrated).

Here, in the first embodiment, the pixel section 11 is configured so that the gap $d_A$ is equal to or smaller than the threshold $d_O$. Accordingly, in the case where the spatial frequency fs is equal to or lower than the Nyquist frequency fn, it is possible to improve image quality of the picked-up image. The reason is described below.

Specifically, as described above, the radiation image pickup unit 1 is configured by bonding the device substrate 110 and the supporting substrate 120 that is provided with the wavelength conversion layer 25 and the partition wall 26. At this time, ideally, the device substrate 110 and the wavelength conversion layer 25 are closely bonded to each other over the entire surface of the pixel section 11. However, actually, a gap occurs between the device substrate 110 and the wavelength conversion layer 25 due to distortion or irregularity of the surface of the device substrate 110. As illustrated in FIG. 7A, when the gap is large to some extent (a size of the gap $d_{100} > d_O$), light ($L_{100}$) emitted from the wavelength conversion layer 25 may reach adjacent pixels without remaining in one pixel 20 in some cases. Moreover, the received light amount may be decreased by refraction or scattering by the gap in some cases. This may cause degradation of resolution as a sensor. In addition, if the size of the gap varies in plane, brightness in plane in the picked-up image may become uneven.

In contrast thereto, in the first embodiment, as illustrated in FIG. 7B, the intermediate layer 24A is provided between the device substrate 110 and the wavelength conversion layer 25 so that the gap d becomes the gap $d_A$ ($<=d_O$). Accordingly, the gap d is optimized, and the light $L_A$ emitted from the wavelength conversion layer 25 is difficult to be leaked to adjacent pixels and is received by one pixel 20. Moreover, since refraction and scattering are allowed to be suppressed by interposition of the intermediate layer 24A, larger amount of light is easily taken, which makes it possible to suppress reduction of the received light amount. Accordingly, reduction of MTF (sharpness) of the picked-up image is suppressed.

As described above, in the first embodiment, the gap d between the device substrate 110 having the photoelectric conversion element 21 for each pixel 20 and the wavelength conversion layer 25 is configured so as to be equal to or larger than the threshold $d_O$ or equal to or smaller than the threshold $d_O$ based on the spatial frequency fs of the image pickup target. Specifically, in the first embodiment, in the case where the spatial frequency fs is equal to or lower than the Nyquist frequency fn, the gap d is configured so as to be equal to or smaller than the threshold $d_O$. Therefore, the gap d is optimized based on the spatial frequency fs, and thus reduction of the MTF (sharpness) of the picked-up image and the like are allowed to be suppressed. Consequently, it is possible to improve image quality of the picked-up image.

Other embodiments and modifications thereof will be described below. Note that like numerals are used to designate substantially like components of the above-described first embodiment, and the description thereof is appropriately omitted.

Second Embodiment (Structure)

FIG. 8 illustrates a sectional-surface-structure of the pixel section 11 according to a second embodiment of the disclosure. In the second embodiment, optimization of the gap d in a case where the spatial frequency fs of the image pickup target is equal to or higher than the Nyquist frequency fn (fs>=fn) is described. In this case, the pixel section 11 is configured so that the gap d is a value ($d_s$) equal to or larger than the above-described threshold do. Specifically, the gap $d_s$ is represented by the following expressions (B) and (2).

[Math. 3]

$$d = d_B \geq \frac{\left(s + \frac{w}{2}\right)}{\tan A_2} \quad (B)$$

$$A_2 = \sin^{-1}\left(n_1 \cdot \frac{\sin A_1}{n_2}\right) \quad (2)$$

A planarizing layer 24B (a first intermediate layer) as a specific example of the above-described intermediate layer 24 is formed between the device substrate 110 and the wavelength conversion layer 25. For example, the planarizing layer 24B may be formed of a planarizing material such as an organic material. By interposition of the planarizing layer 24B, distortion and irregularity of the device substrate 110 are allowed to be suppressed while optimizing the gap d. Therefore, as compared with a case where only an air layer is provided between the device substrate 110 and the wavelength conversion layer 25, it is possible to suppress in-plane variation of the gap d to suppress unevenness of brightness.

(Function and Effects)

Also in the second embodiment, as with the above-described first embodiment, when radiations such as X-rays enter the pixel section, the radiations are absorbed by the wavelength conversion layer 25 and visible light is emitted. The visible light is received by the respective pixels 20 (by the respective photoelectric conversion elements 21) in the device substrate 110. As a result, signal charges based on the incident light are generated in the respective pixels 20, and the generated signal charges are read out to the signal line Lsig. The read signal charges are transmitted as the output data Dout to the outside (or input to an internal memory not illustrated).

In this case, in the second embodiment, the pixel section 11 is configured so that the gap $d_B$ is equal to or larger than $d_O$. Accordingly, it is possible to improve the image quality of the picked-up image when the spatial frequency fs is equal to or higher than the Nyquist frequency fn. The reason is described below.

FIGS. 9A and 9B schematically illustrate a waveform (a solid line: S1) of X-ray transmittance of the image pickup target in a case where the spatial frequency fs is equal to or higher than the Nyquist frequency fn and a waveform (alternate long and short dash lines: S101 and S2) of a signal value obtained from the respective pixels 20, together with the structure of the main part of the pixel section 11. In this case, the visible light generated in the wavelength conversion layer 25 is difficult to be diffused and reflected by the partition wall 26. Therefore, when the gap $d_{101}$ is smaller than the threshold $d_O$ as illustrated in FIG. 9A, light $L_{101}$ emitted from the wavelength conversion layer 25 is easily selectively received by the corresponding pixel 20. As a result, as illustrated by the waveform S101, so-called aliasing noise occurs, which causes moire in the picked-up image.

In contrast thereto, in the second embodiment, as illustrated in FIG. 9B, the gap d between the device substrate 110 and the wavelength conversion layer 25 is configured so as to be equal to the gap $d_B$ ($\geq d_O$). Therefore, the gap d is optimized, and light LB emitted from the wavelength conversion layer 25 is scattered and received by not only the corresponding pixel 20 but also adjacent pixels. As a result, as illustrated by the waveform S2, aliasing noise is reduced and occurrence of moire in the picked-up image is suppressed.

As described above, in the second embodiment, the gap d between the device substrate 110 having the photoelectric conversion element 21 for each pixel and the wavelength conversion layer 25 is configured so as to be equal to or larger than the threshold $d_O$ or equal to or smaller than the threshold $d_O$ based on the special frequency fs of the image pickup target. Specifically, in the second embodiment, when the spatial frequency fs is equal to or higher than the Nyquist frequency fn, the gap d ($d_B$) is configured so as to be equal to or larger than the threshold $d_O$. Therefore, the gap d is optimized based on the spatial frequency fs, which makes it possible to suppress occurrence of moire in the picked-up image and the like. Accordingly, it is possible to improve the image quality of the picked-up image.

Third Embodiment

FIG. 10 illustrates a sectional-surface structure of the pixel section 11 according to a third embodiment of the disclosure. Although the case where one intermediate layer is provided between the device substrate 110 and the wavelength conversion layer 25 has been described in the above-described first and second embodiments, the intermediate layer may be configured of two or more layers. Here, the case described in the above-described second embodiment (the case of fs>=fn) is taken as an example, and optimization of the gap d in the case where the intermediate layer is configured of two layers is described. Specifically, in the third embodiment, as the above-described intermediate layer 24, an intermediate layer 24C (a first intermediate layer) and an intermediate layer 24D (a second intermediate layer) are included in order from the wavelength conversion layer 25.

A threshold do' in the third embodiment is represented by the following expressions (3) to (8). Incidentally, $d_1$ represents a film thickness of the intermediate layer 24C, $d_2$ represents a film thickness of the intermediate layer 24D, $A_1$ represents an incident angle (a maximum value) to an interface between the wavelength conversion layer 25 and the intermediate layer 24C, $A_2$ represents a refraction angle (an incident angle to an interface between the intermediate layers 24C and 24D) at the interface between the wavelength conversion layer 25 and the intermediate layer 24C, $A_3$ represents a refraction angle at the interface between the intermediate layers 24C and 24D, $n_2$ represents a refractive index of the intermediate layer 24C, and $n_3$ represents a refractive index of the intermediate layer 24D.

[Math. 4]

$$do' = d_1 + d_2 \quad (3)$$

$$d_1 = \frac{s_1}{\tan A_2} \quad (4)$$

$$d_2 = \frac{s_2}{\tan A_2} \quad (5)$$

$$A_2 = \sin^{-1}\left(n_1 \cdot \frac{\sin A_1}{n_2}\right) \quad (6)$$

-continued $$A_3 = \sin^{-1}\left(n_2 \cdot \frac{\sin A_2}{n_3}\right) \quad (7)$$

$$s_1 + s_2 = s + \frac{w}{2} \quad (8)$$

When the intermediate layers 24C and 24D are provided in this way, the optimization of the gap d based on the spatial frequency fs is performed with use of the above-described threshold $d_O{}'$. For example, when the spatial frequency fs is equal to or higher than the Nyquist frequency fn, the pixel section 11 is configured so that the gap d is equal to or larger than $d_O{}'$. Alternatively, although not illustrated, when the spatial frequency fs is equal to or lower than the Nyquist frequency fn, it is only necessary to configure the pixel section 11 so that the gap d is equal to or smaller than the threshold $d_O{}'$.

Also in the third embodiment, appropriately setting the refractive index, the film thickness, and the like of each of the intermediate layers 24C and 24D makes it possible to optimize the gap d. Accordingly, it is possible to obtain effects equivalent to those in the above-described first embodiment (or the above-described second embodiment).

Note that, in this example, the case where the intermediate layer is configured of two layers has been described as an example; however, the intermediate layer may be configured of three or more layers. In such a case, the number of parameters such as d, A, n, and s are increased, and the gap d at the time when the light emitted from the wavelength conversion layer 25 enters an end of the photoelectric conversion element 21 of an adjacent pixel is set as the threshold.

Specific examples of the above-described intermediate layers 24C and 24D are described below as modifications (modifications 1-1 to 1-3) of the above-described third embodiment.

<Modification 1-1>

FIG. 11 illustrates a structure of a main part of a pixel section according to a modification 1-1. As illustrated in FIG. 11, an air layer 24c1 and a planarizing layer 24d1 may be provided between the device substrate 110 and the wavelength conversion layer 25 in order from the wavelength conversion layer 25 side. The air layer 24c1 is formed by the fact that the wavelength conversion layer 25 is formed in a part of the opening of the partition wall 26 (a scintillator material is filled in a part of the opening). Note that the planarizing layer 24d1 is formed of a planarizing material similar to that in the above-described second embodiment.

<Modification 1-2>

FIG. 12 illustrates a structure of a main part of a pixel section according to a modification 1-2. As illustrated in FIG. 12, a bonding layer 24c2 and a planarizing layer 24d2 may be provided between the device substrate 110 and the wavelength conversion layer 25 in order from the wavelength conversion layer 25 side. The bonding layer 24c2 may be formed of, for example, a UV curable resin, and the planarizing layer 24d2 is formed of a planarizing material similar to that in the above-described second embodiment.

<Modification 1-3>

FIG. 13 illustrates a structure of a main part of a pixel section according to a modification 1-3. As illustrated in FIG. 13, a bonding layer 24c3 and a planarizing layer 24d3 may be provided between the device substrate 110 and the wavelength conversion layer 25 in order from the wavelength conversion layer 25 side. The bonding layer 24c3 may be formed of, for example, a UV curable resin or the like that contains the same material (the scintillator material) as that of the wavelength conversion layer 25. Note that the planarizing layer 24d3 is formed of a planarizing material similar to that in the above-described second embodiment. In addition, although not illustrated, the planarizing layer 24d3 may contain the scintillator material.

<Modification 2>

FIG. 12 illustrates a circuit configuration of a pixel (a pixel 20A) according to a modification 2, together with a circuit configuration example of the charge amplifier circuit 171 described in the above-described embodiments. The pixel 20A of the present modification has a so-called passive circuit configuration as with the pixel 20 in the embodiments, and has one photoelectric conversion element 21 and one TFT 22. Moreover, the readout control line Lread extending along the H direction and the signal line Lsig extending along the V direction are connected to the pixel 20A.

However, in the pixel 20A of the present modification, unlike the pixel 20 of the above-described embodiments, the anode of the photoelectric conversion element 21 is connected to the storage node N, and the cathode thereof is connected to the ground (is grounded). In this way, in the pixel 20A, the anode of the photoelectric conversion element 21 may be connected to the storage node N.

<Modification 3>

FIG. 15 illustrates a circuit configuration of a pixel (a pixel 20B) according to a modification 3, together with the circuit configuration example of the charge amplifier circuit 171 described in the above-described embodiments. The pixel 20B of the present modification has a so-called passive circuit configuration as with the pixel 20 of the embodiments, has one photoelectric conversion element 21, and is connected to the readout control line Lread extending along the H direction and the signal line Lsig extending along the V direction.

However, in the present modification, the pixel 20B has two TFTs 22. The two TFTs 22 are connected in series to each other (a source or a drain of one of the TFTs 22 is electrically connected to a source or a drain of the other TFT 22). In this way, two TFTs 22 are provided in one pixel 20B, which makes it possible to reduce off-leak.

<Modifications 4-1 and 4-2>

FIG. 16 illustrates a circuit configuration of a pixel (a pixel 20C) according to a modification 4-1, together with a circuit configuration example of a charge amplifier circuit 171A described below. Moreover, FIG. 17 illustrates a circuit configuration of a pixel (a pixel 20D) according to a modification 4-2, together with the circuit configuration example of the charge amplifier circuit 171A. Each of the pixels 20C and 20D has a so-called active pixel circuit, unlike the pixels 20, 20A, and 20B described above.

In each of the active type pixels 20C and 20D, one photoelectric conversion element 21 and three TFTs 22A, 22B, and 22C are provided. In addition, the readout control line Lread and the reset control line Lrst that extend along the H direction and the signal line Lsig extending along the V direction are connected to each of the pixels 20C and 20D.

In each of the pixels 20C and 20D, a gate of the TFT 22A is connected to the readout control line Lread, a source thereof is connected to the signal line Lsig, and a drain thereof is connected to a drain of the transistor 22B configuring the source follower circuit. A source of the transistor 22B is connected to the power source VDD, and a gate thereof is connected to the cathode (in the example of FIG. 16) or the anode (in the example of FIG. 17) of the photoelectric element 21 and a drain of the transistor 22C functioning as a reset transistor, through the storage node N. A gate of the transistor 22C is connected to the reset control line Lrst, and a source thereof is supplied with the reset voltage Vrst. In the modification 4-1, the anode of the photoelectric conversion element 21 is connected to the ground, and in the modification 4-2, the cathode of the photoelectric conversion element 21 is connected to the ground.

Moreover, the charge amplifier circuit 171A has an amplifier 176 and a constant current source 177 in place of the charge amplifier 172, the capacitor C1, and the switch SW1 in the above-described charge amplifier circuit 171. In the amplifier 176, the signal line Lsig is connected to an input terminal on a positive side, and an input terminal on a negative side and an output terminal are connected to each other to form a voltage follower circuit. Note that a first terminal of the constant current source 177 is connected to one end of the signal line Lsig, and a second terminal of the constant current source 177 is connected to the power source VSS.

<Application Example>

Subsequently, the radiation image pickup unit according to any of the above-described embodiments and the modifications is applicable to a radiation image pickup display system described below.

FIG. 18 schematically illustrates a schematic configuration example of a radiation image pickup display system (a radiation image pickup display system 5) according to an application example. The radiation image pickup display system 5 includes the radiation image pickup unit 1 having the pixel section 11 and the like according to the above-described embodiments and the like, an image processing section 52, and a display unit 4.

The image processing section 52 performs predetermined image processing on the output data Dout (an image pickup signal) output from the radiation image pickup unit 1, to generate image data D1. The display unit 4 performs image display based on the image data D1 generated by the image processing section 52, on a predetermined monitor screen 40.

In the radiation image pickup display system 5, the radiation image pickup unit 1 acquires the image data Dout of an object 50 based on radiations applied from a radiation source 51 such as an X-ray source toward the object 50, and outputs the image data Dout to the image processing section 52. The image processing section 52 performs the above-described predetermined image processing on the input image data Dout, and outputs the image-processed image data (display data) D1 to the display unit 4. The display unit 4 displays image information (picked-up image) on the monitor screen 40, based on the input image data D1.

In this way, in the radiation image pickup display system 5 of the present application example, an image of the object 50 is allowed to be acquired as an electric signal by the radiation image pickup unit 1, and therefore it is possible to perform image display by transmitting the acquired electric signal to the display unit 4. In other words, it is possible to observe the image of the object 50 without using radiation photogram films and it is possible to achieve moving picture shooting and moving picture display.

Hereinbefore, although the embodiments, the modifications, and the application example have been described, the contents of the present disclosure are not limited to the embodiments and the like, and various modifications may be made. For example, the circuit configurations of the pixels in the pixel section according to the above-described embodiments and the like are not limited to those described above (the circuit configurations of the pixels 20, and 20A to 20D), and other circuit configuration may be employed. Likewise, the circuit configurations of the row scan section, the column selection section, and the like are not limited to those described in the above-described embodiments and the like, and other circuit configurations may be employed.

Further, the pixel section, the row scan section, the A/D conversion section (the column selection section), the column scan section, and the like that are described in the above-described embodiments and the like may be formed on the same substrate, for example. Specifically, for example, a polycrystalline semiconductor such as low-temperature polycrystalline silicon is used to allow switches and the like in the circuit part to be formed on the same substrate. Therefore, for example, it is possible to perform drive operation on the same substrate, for example, based on control signals from an external system control section, and thus it is possible to achieve improvement in reliability at the time of decreasing width of a bezel (a frame structure of three free sides) and connecting wirings.

Note that the present disclosure may be configured as follows.

(1) A radiation image pickup unit including:
a plurality of pixels each configured to generate a signal charge based on a radiation;
a device substrate including a photoelectric conversion element for each pixel;
a wavelength conversion layer provided on a light incident side of the device substrate, and configured to convert a wavelength of the radiation into other wavelength; and
a partition wall separating the wavelength conversion layer for each pixel, wherein
the radiation image pickup unit is configured to allow a gap between the wavelength conversion layer and the device substrate to be equal to or larger than a threshold or equal to or smaller than the threshold, the threshold being preset based on a spatial frequency of an image pickup target.

(2) The radiation image pickup unit according to (1), wherein the gap is set to be equal to or smaller than the threshold when the spatial frequency is equal to or lower than half Nyquist frequency.

(3) The radiation image pickup unit according to (1), wherein the gap is set to be equal to or larger than the threshold when the spatial frequency is equal to or higher than half Nyquist frequency.

(4) The radiation image pickup unit according to any one of (1) to (3), further including
a first intermediate layer provided between the wavelength conversion layer and the device substrate, wherein
the threshold ($d_O$) is represented by following expressions (1) and (2),
[Math. 5]
where s is a minimum value of a distance between an end of the photoelectric conversion element and an end of the pixel,
w is a width of the partition wall,
$A_1$ is an incident angle to an interface between the wavelength conversion layer and the first intermediate layer,
$A_2$ is a refraction angle at the interface between the wavelength conversion layer and the first intermediate layer,
$n_1$ is a refractive index of the wavelength conversion layer, and
$n_2$ is a refractive index of the first intermediate layer.

(5)
The radiation image pickup unit according to (4), wherein the first intermediate layer is formed of a material same as a material of the wavelength conversion layer.
(6)
The radiation image pickup unit according to (4) or (5), wherein the first intermediate layer is a planarizing layer.
(7)
The radiation image pickup unit according to any one of (1) to (3), further including
a first intermediate layer and a second intermediate layer that are provided between the wavelength conversion layer and the device substrate in order from the wavelength conversion layer side, wherein
the threshold ($d_O'$) is represented by following expressions (3) to (8),
[Math. 6]
where s is a minimum value of a distance between an end of the photoelectric conversion element and an end of the pixel,
w is a width of the partition wall,
$d_1$ is a film thickness of the first intermediate layer,
$d_2$ is a film thickness of the second intermediate layer,
$A_1$ is an incident angle to an interface between the wavelength conversion layer and the first intermediate layer,
$A_2$ is a refraction angle at the interface between the wavelength conversion layer and the first intermediate layer (an incident angle to an interface between the first intermediate layer and the second intermediate layer),
$A_3$ is a refraction angle at the interface between the first intermediate layer and the second intermediate layer,
$n_1$ is a refractive index of the wavelength conversion layer,
$n_2$ is a refractive index of the first intermediate layer, and
$n_3$ is a refractive index of the second intermediate layer.
(8)
The radiation image pickup unit according to (7), wherein the first intermediate layer is an air layer, and
the second intermediate layer is a planarizing layer.
(9)
The radiation image pickup unit according to (7), wherein the first intermediate layer is a bonding layer, and
the second intermediate layer is a planarizing layer.
(10)
The radiation image pickup unit according to (9), wherein the bonding layer or the planarizing layer contains a material same as a material of the wavelength conversion layer.
(11)
A radiation image pickup display system provided with a radiation image pickup unit and a display unit configured to perform image display based on an image pickup signal that is obtained by the radiation image pickup unit, the radiation image pickup unit including:
a plurality of pixels each configured to generate a signal charge based on a radiation;
a device substrate including a photoelectric conversion element for each pixel;
a wavelength conversion layer provided on a light incident side of the device substrate, and configured to convert a wavelength of the radiation into other wavelength; and
a partition wall separating the wavelength conversion layer for each pixel, wherein
the radiation image pickup unit is configured to allow a gap between the wavelength conversion layer and the device substrate to be equal to or larger than a threshold or equal to or smaller than the threshold, the threshold being preset based on a spatial frequency of an image pickup target.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Radiation image pickup unit
11 Pixel section
13 Row scan section
14 A/D conversion section
15 Column scan section
16 System control section
17 Column selection section
171, 171A Charge amplifier circuit
172 Charge amplifier
173 S/H circuit
174 Multiplexer circuit
175 A/D converter
176 Amplifier
177 Constant current source
20, 20A to 20D Pixel (image pickup pixel)
21 Photoelectric conversion element
22A, 22B, 22C Transistor
110 Device substrate
23 Wiring
24, 24A, 24C, 24D Intermediate layer
24B Planarizing layer
25 Wavelength conversion layer
26 Partition wall
120 Supporting substrate
4 Display unit
40 Monitor screen
5 Radiation image pickup display system
50 Object
51 Light source (radiation source)
52 Image processing section
Lsig Signal line
Lread Readout control line
Lbias Bias line
Lrst Reset control line
Lcarst Amplifier reset control line
Dout Output data
N Storage node
SW1 Switch
d Gap
$d_O$, $d_O'$ Threshold
w Width of partition wall
p Pixel pitch

The invention claimed is:
1. A radiation image pickup unit, comprising:
a plurality of pixels, wherein each pixel of the plurality of pixels is configured to generate a signal charge based on a radiation;
a device substrate including a photoelectric conversion element for each pixel;
a wavelength conversion layer, on a light incident side of the device substrate, configured to convert a first wavelength of the radiation into a second wavelength; and
a partition wall to separate the wavelength conversion layer for each pixel of the plurality of pixels,
wherein the radiation image pickup unit further comprises a gap, between the wavelength conversion layer and the device substrate, based on a spatial frequency of an image pickup target.

2. The radiation image pickup unit according to claim 1, wherein the gap is equal to or smaller than a threshold (do) when the spatial frequency is equal to or lower than a Nyquist frequency.

3. The radiation image pickup unit according to claim 2, further comprising a first intermediate layer and a second intermediate layer that are provided between the wavelength conversion layer and the device substrate in an order from a wavelength conversion layer side, wherein the threshold (do) is represented by following expressions (3) to (8), $$do = d_1 + d_2 \quad (3)$$

$$d_1 = \frac{s_2}{\tan A_2} \quad (4)$$

$$d_2 = \frac{s_3}{\tan A_3} \quad (5)$$

$$A_2 = \sin^{-1}\left(n_1 \cdot \frac{\sin A_1}{n_2}\right) \quad (6)$$

$$A_3 = \sin^{-1}\left(n_2 \cdot \frac{\sin A_2}{n_3}\right) \quad (7)$$

$$s_1 + s_2 = s + \frac{w}{2} \quad (8)$$

where s is a minimum value of a distance between an end of the photoelectric conversion element and an end of a corresponding pixel,
w is a width of the partition wall,
$d_1$ is a film thickness of the first intermediate layer,
$d_2$ is a film thickness of the second intermediate layer,
$A_1$ is an incident angle to an interface between the wavelength conversion layer and the first intermediate layer,
$A_2$ is a refraction angle at the interface between the wavelength conversion layer and the first intermediate layer,
$A_3$ is a refraction angle at the interface between the first intermediate layer and the second intermediate layer,
$n_1$ is a refractive index of the wavelength conversion layer,
$n_2$ is a refractive index of the first intermediate layer, and
$n_3$ is a refractive index of the second intermediate layer.

4. The radiation image pickup unit according to claim 3, wherein the first intermediate layer is an air layer, and the second intermediate layer is a planarizing layer.

5. The radiation image pickup unit according to claim 3, wherein the first intermediate layer is a bonding layer, and the second intermediate layer is a planarizing layer.

6. The radiation image pickup unit according to claim 5, wherein one of the bonding layer or the planarizing layer contains a material same as a material of the wavelength conversion layer.

7. The radiation image pickup unit according to claim 1, wherein the gap is equal to or larger than a threshold when the spatial frequency is equal to or higher than a Nyquist frequency.

8. The radiation image pickup unit according to claim 2, further comprising
a first intermediate layer between the wavelength conversion layer and the device substrate, wherein the threshold (do) is represented by following expressions (1) and (2), $$do = \frac{\left(s + \frac{w}{2}\right)}{\tan A_2} \quad (1)$$

$$A_2 = \sin^{-1}\left(n_1 \cdot \frac{\sin A_1}{n_2}\right) \quad (2)$$

where s is a minimum value of a distance between an end of the photoelectric conversion element and an end of a corresponding pixel,
w is a width of the partition wall,
$A_1$ is an incident angle to an interface between the wavelength conversion layer and the first intermediate layer,
$A_2$ is a refraction angle at the interface between the wavelength conversion layer and the first intermediate layer,
$n_1$ is a refractive index of the wavelength conversion layer, and
$n_2$ is a refractive index of the first intermediate layer.

9. The radiation image pickup unit according to claim 8, wherein the first intermediate layer is of a material same as a material of the wavelength conversion layer.

10. The radiation image pickup unit according to claim 8, wherein the first intermediate layer is a planarizing layer.

11. A radiation image pickup display system, comprising:
a radiation image pickup unit; and
a display unit configured to display an image based on an image pickup signal that is obtained by the radiation image pickup unit,
wherein the radiation image pickup unit comprising:
a plurality of pixels, wherein each pixel of the plurality of pixels is configured to generate a signal charge based on a radiation;
a device substrate including a photoelectric conversion element for each pixel;
a wavelength conversion layer, on a light incident side of the device substrate, configured to convert a first wavelength of the radiation into a second wavelength; and
a partition wall to separate the wavelength conversion layer for each pixel,
wherein the radiation image pickup unit further comprises a gap between the wavelength conversion layer and the device substrate, based on a spatial frequency of an image pickup target.

* * * * *